US012094938B2

(12) United States Patent
Huang et al.

(10) Patent No.: US 12,094,938 B2
(45) Date of Patent: Sep. 17, 2024

(54) SEMICONDUCTOR DEVICE WITH LOW RESISTANCES AND METHODS OF FORMING SUCH

(71) Applicant: Taiwan Semiconductor Manufacturing Company, Ltd., Hsinchu (TW)

(72) Inventors: Yu-Xuan Huang, Hsinchu (TW); Wang-Chun Huang, Hsinchu (TW); Yi-Bo Liao, Hsinchu (TW); Cheng-Ting Chung, Hsinchu (TW); Hou-Yu Chen, Hsinchu County (TW); Kuan-Lun Cheng, Hsin-Chu (TW); Wei Ju Lee, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 422 days.

(21) Appl. No.: 17/460,847

(22) Filed: Aug. 30, 2021

(65) Prior Publication Data

US 2023/0064635 A1     Mar. 2, 2023

(51) Int. Cl.
| | |
|---|---|
| *H01L 29/41* | (2006.01) |
| *H01L 29/08* | (2006.01) |
| *H01L 29/40* | (2006.01) |
| *H01L 29/417* | (2006.01) |
| *H01L 29/66* | (2006.01) |
| *H01L 29/423* | (2006.01) |
| *H01L 29/45* | (2006.01) |
| *H01L 29/786* | (2006.01) |

(52) U.S. Cl.
CPC .... *H01L 29/41733* (2013.01); *H01L 29/0847* (2013.01); *H01L 29/401* (2013.01); *H01L 29/66742* (2013.01); *H01L 29/42392* (2013.01); *H01L 29/45* (2013.01); *H01L 29/66545* (2013.01); *H01L 29/78618* (2013.01); *H01L 29/78696* (2013.01)

(58) Field of Classification Search
CPC .......... H01L 29/41733; H01L 29/0847; H01L 29/401; H01L 29/66742; H01L 29/42392; H01L 29/45; H01L 29/66545; H01L 29/78618; H01L 29/78696; H01L 21/28518; H01L 29/0673; H01L 29/6656; H01L 29/41766; H01L 29/66439; H01L 29/775; H01L 29/165; H01L 29/7845; H01L 29/7848; B82Y 10/00
USPC ....................................................... 257/384
See application file for complete search history.

(56) References Cited

U.S. PATENT DOCUMENTS

| | | | |
|---|---|---|---|
| 2019/0181224 A1* | 6/2019 | Zhang | ............... H01L 29/66553 |
| 2020/0388688 A1* | 12/2020 | Baraskar | ............. H01L 23/5226 |

(Continued)

*Primary Examiner* — Mohammad M Hoque
(74) *Attorney, Agent, or Firm* — HAYNES AND BOONE, LLP

(57) ABSTRACT

In an exemplary aspect, the present disclosure is directed to a device. The device includes a semiconductor substrate, a stack of semiconductor layers over the semiconductor substrate, a gate structure over and between the stack of semiconductor layers, where the gate structure engages with the stack of semiconductor layers. Moreover, the device also includes a silicide layer extending along sidewall surfaces of the stack of semiconductor layers, and a source/drain feature on a sidewall surface of the silicide layer.

20 Claims, 15 Drawing Sheets

(56) References Cited

U.S. PATENT DOCUMENTS

2021/0217860 A1* 7/2021 Ha .................... H01L 29/42356
2023/0011153 A1* 1/2023 Kim ..................... H01L 29/665

* cited by examiner

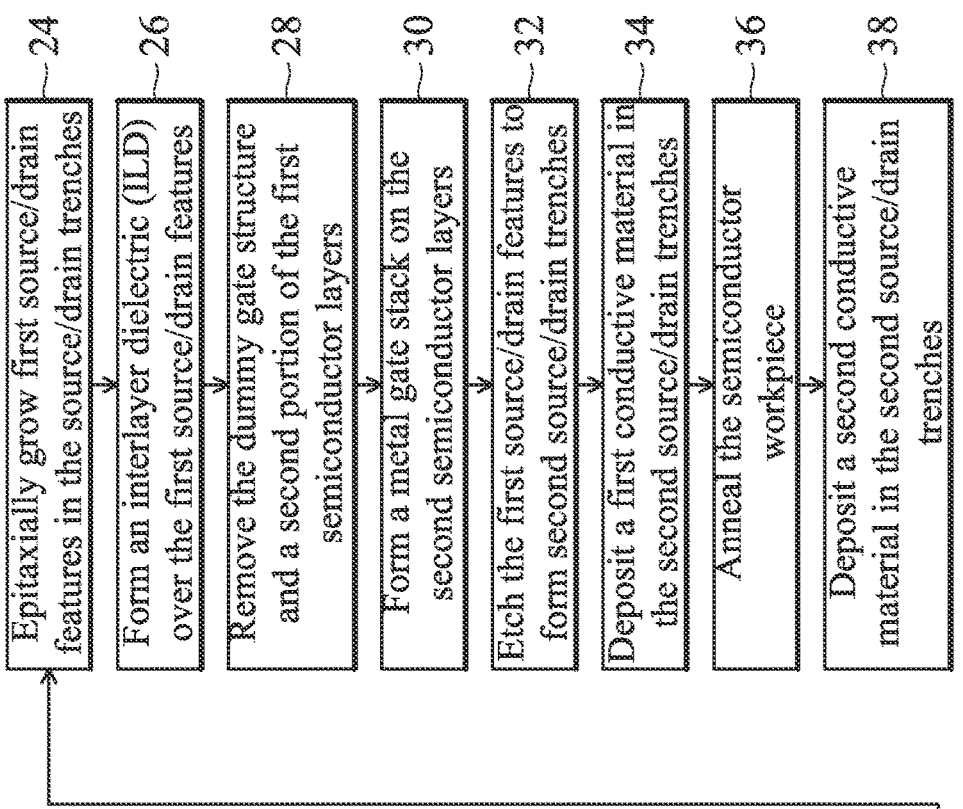
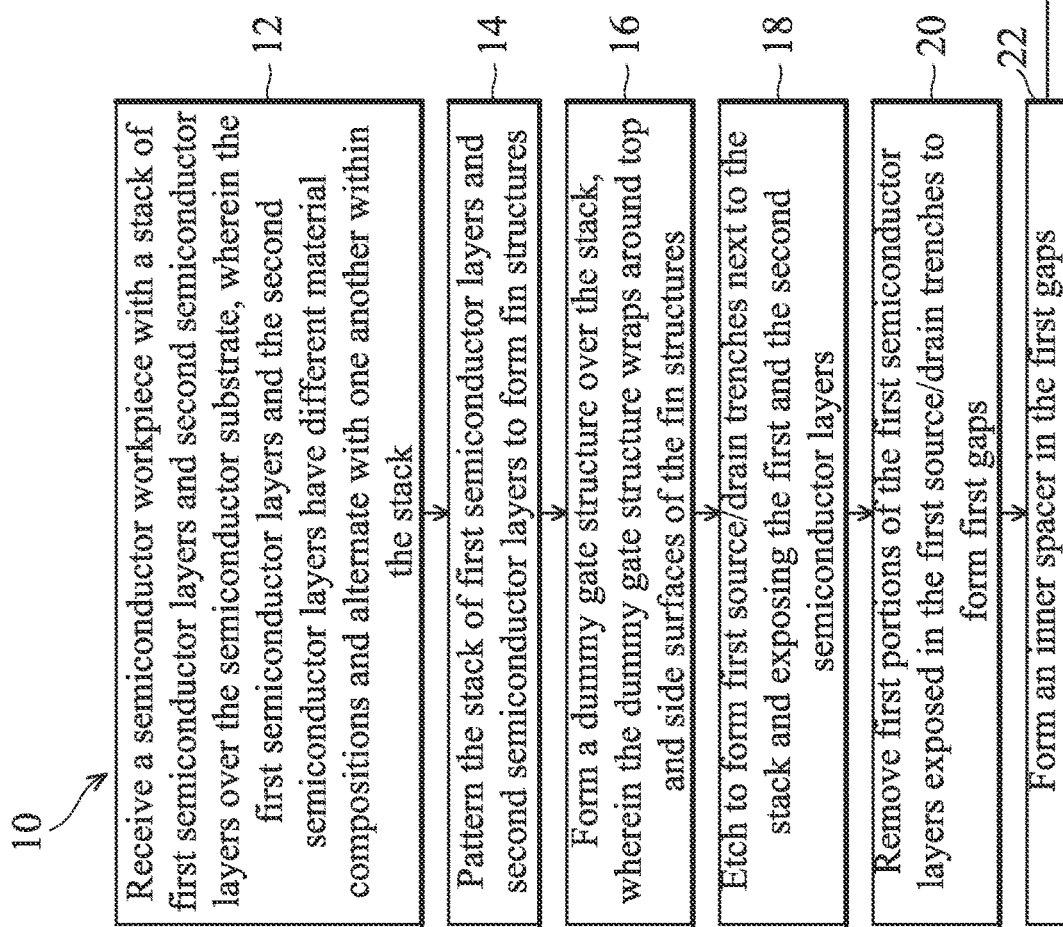
FIG. 2

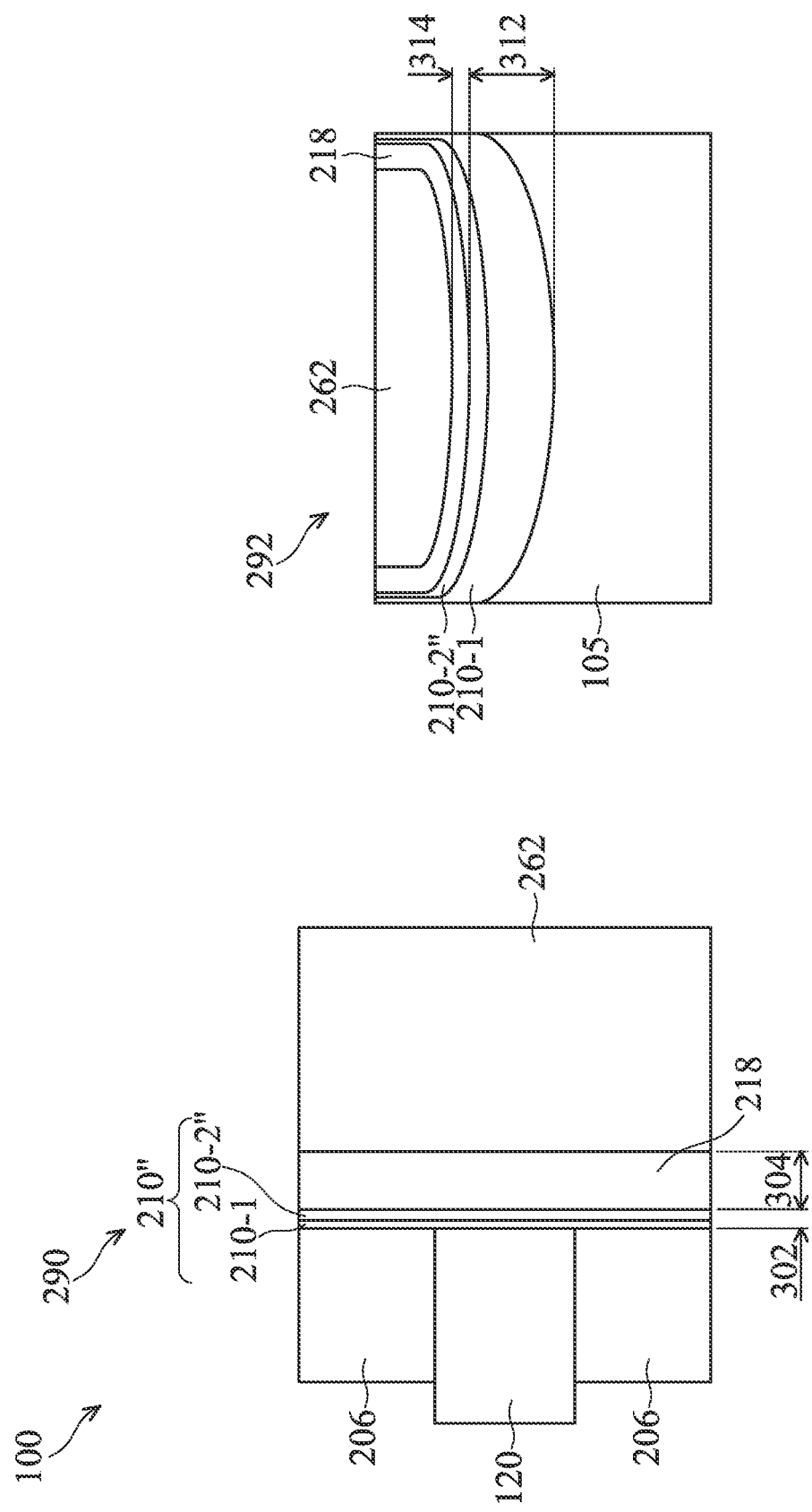

SEMICONDUCTOR DEVICE WITH LOW RESISTANCES AND METHODS OF FORMING SUCH

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, a lower transistor resistance is generally beneficial for circuit speed improvement. To that end, semiconductor devices sometimes implement strained source/drain structures to achieve reduced resistances in the semiconductor channels. Such strains within the source/drain structures, however, sometimes increase the resistances inside the source/drain structures. As the scale-down continues, this latter effect becomes more evident and substantially offset the speed improvement associated with the channel resistance reduction. Accordingly, although existing source/drain technologies are generally adequate for their intended purposes, they are not satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow chart of a method for fabricating a device of the present disclosure according to some embodiments of the present disclosure.

FIGS. 13 and 14 are expanded cross-sectional views of portions of an embodiment of a device of the present disclosure, according to some embodiments of the present disclosure.

DETAILED DESCRIPTION

Figure 1B:
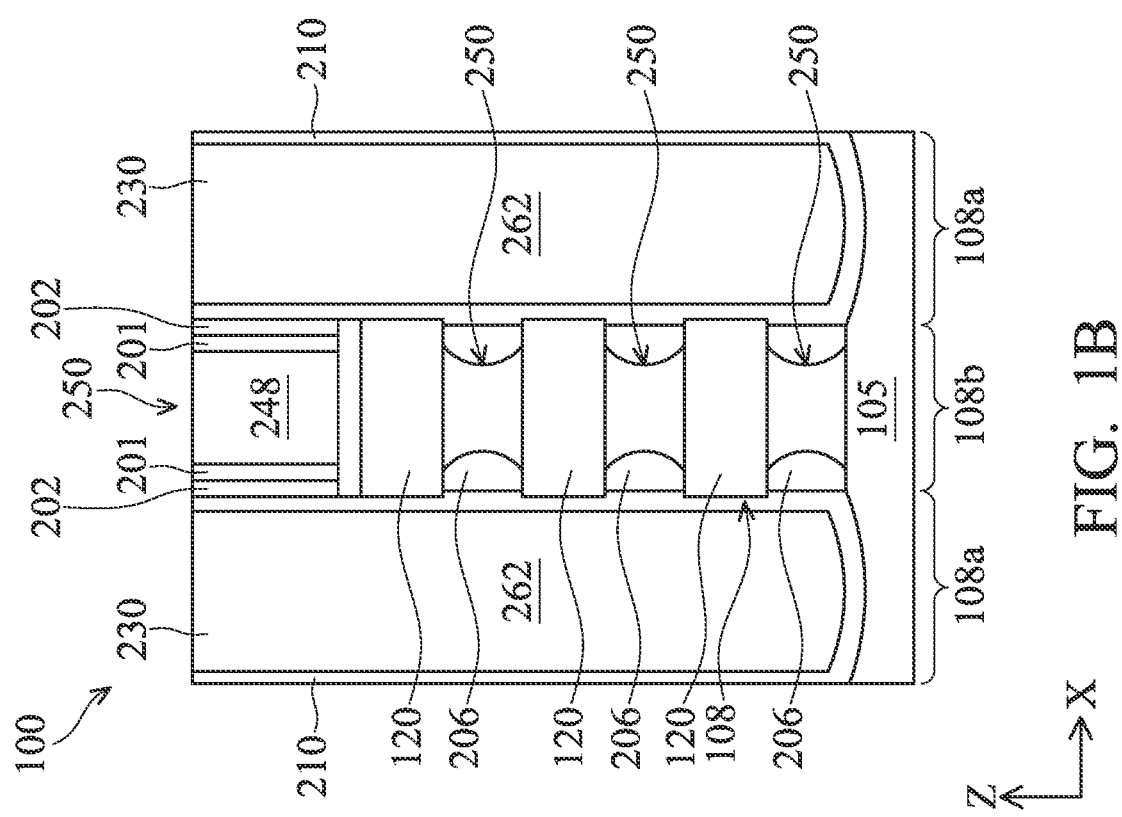
FIG. 1B is a cross-sectional view of an embodiment of a device of the present disclosure along the line A-A' in FIG. 1A constructed according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

The present disclosure is generally related to ICs and semiconductor devices and methods of forming the same. More particularly, the present disclosure is related to semiconductor devices with reduced transistor resistances. Transistor resistances are affected by both the resistance within the transistor channels and the resistance within the source/drain features. Oftentimes, the resistances in the transistor channel are the bottleneck for the transistor current. As a result, resistance reduction for the transistor channel has been the focus of research. Generally for p-type transistors, one approach to reduce channel resistances is to induce a compressive stress on the lattice of the semiconductor channel materials, for example, by configuring the source/drain features to include proper materials, dopant elements, and dopant profiles. The compressive stress improves the mobility of the holes (as charge carriers for the p-type transistors) inside the semiconductor matrix material, thereby improving the speed of the charge carriers migrating through the channels. Meanwhile, an opposite effect is asserted on the lattice structure of the source/drain features on both ends of the transistor channel, and resistances therein undesirably increases. As the scale-down process continues and the device features continue to shrink in their respective dimensions, such source/drain resistances start to play more and more important roles. Sometimes, the increase in the source/drain resistances substantially offsets any improvements contributable to the channel resistance reduction. Therefore, this present disclosure provides a device structure that exhibits low source/drain resistances without negating the resistance reduction in the transistor channel. As a result, the device performance further improves.

The disclosure below describe the structures and methods using nanosheet-based devices as an example. However, the present disclosure may be applied to any other devices, such as planar FETs, FinFETs, multi-gate devices, three-dimensional devices, or any other similar devices. The devices may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. One of ordinary skill may recognize other examples of semiconductor devices that may benefit from aspects of the present disclosure.

Nanosheet-based devices are sometimes referred to as gate-all-around (GAA) devices, multi-bridge-channel (MBC) devices, or some other names. A nanosheet-based device includes a plurality of channel layers engaged by a gate structure, where the channel layers are oriented horizontally and stacked one on top of another. The channel layers of a nanosheet-based device may be of any suitable shapes and/or configurations. For example, the channel layers may be in one of many different shapes, such as wire (or nanowire), sheet (or nanosheet), bar (or nano-bar), and/or other suitable shapes. In other words, the term nanosheet-based devices broadly encompasses devices having channel layers in nanowire, nano-bars, and any other suitable shapes. Further, the channel layers of the nanosheet-based devices may engage with a single, contiguous gate structure, or multiple gate structures. The channel layers connect a pair of source/drain features, such that the charge carriers may flow from the source region to the drain region through the channel layers during the operation (such as when the transistors are turned on).

Figure 1A:
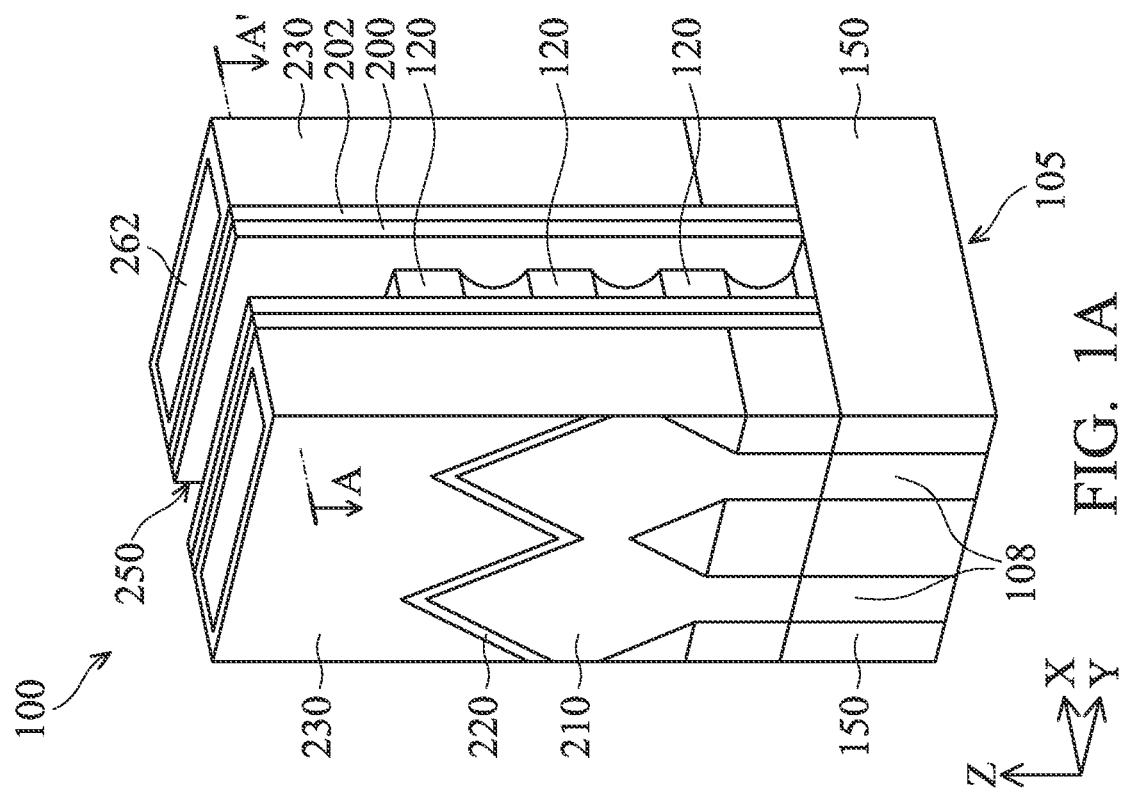
FIG. 1A is a three-dimensional (3D) perspective view of an embodiment of a device of the present disclosure constructed according to some embodiments of the present disclosure.

An example nanosheet-based transistor 100 (or nanosheet-based device 100, or transistor 100, or device 100) is illustrated in FIGS. 1A and 1B. FIG. 1A is a three-dimensional (3D) perspective view of an embodiment of the device 100 of the present disclosure. FIG. 1B is a cross-sectional view of the device 100 of FIG. 1A along the line A-A' in FIG. 1A. As illustrated, the device 100 includes a semiconductor substrate 105 (or hereinafter referred to as substrate 105). Fin structures (or fins), such as fin structures 108, are formed over the substrate 105, each extending lengthwise horizontally in an X-direction and separated from each other horizontally in a Y-direction. The X-direction and the Y-direction are horizontal directions that are perpendicular to each other, and that the Z-direction is a vertical direction that is orthogonal (or normal) to a horizontal XY plane defined by the X-direction and the Y-direction. The substrate 105 may have its top surface parallel to the XY plane.

The fin structures 108 each have a source region 108a, a drain region 108a (collectively, source/drain regions 108a) disposed along the X-direction and spaced away from each other. Epitaxial source/drain layers 210 and additional source/drain layers 262 are formed in the source/drain regions 108a of the fin structures 108. The fin structures 108 each further have a channel region 108b disposed between and connecting the source and drain regions 108a. A stack of suspended semiconductor layers 120 (also interchangeably referred to as "semiconductor layers 120" or "channel layers 120") are formed in the channel region 108b connecting the epitaxial source/drain layer 210; and the stack extends vertically (e.g. along the Z-direction) from the substrate 105. The suspended semiconductor layers 120 may each be in one of many different shapes, such as wire (or nanowire), sheet (or nanosheet), bar (or nano-bar), and/or other suitable shapes, and may be spaced away from each other. The semiconductor layers 120 may each engage with a single, contiguous gate structure 250. The gate structure 250 includes a metal gate stack and gate spacer layer 201 and/or 202 on both sides of the metal gate stack. Additionally, the device 100 includes inner spacers 206 formed between the gate structures 250 and the epitaxial source/drain layer 210, such that the source/drain features may be shielded from the operations targeting the gate structure. The inner spacers 206 may have varying lateral widths across the vertical dimension (such as the dimension perpendicular to the top surface of the substrate). Note that the metal gate stack is illustrated as a transparent feature in FIG. 1A in order to illustrate the features (such as the semiconductor layers 120) that the metal gate stacks cover. Moreover, FIGS. 1A-1B do not depict details of the metal gate stack for simplicity. Those details are described in later figures. The device 100 further includes isolation features 150 within or over the substrate 105, separating adjacent fin structures 108 from each other. The isolation features 150 may be shallow trench isolation (STI) features or any other suitable isolation structures. The additional source/drain layers 262 extends through ILD layer 230 to connect to other conductive features (such as vias, metal lines, etc.). Device 100 may include other suitable features, that have been omitted for simplicity and conciseness.

FIG. 2 is a flow chart of a method for fabricating the nanosheet-based device 100 of the present disclosure according to some embodiments of the present disclosure. FIGS. 3-12 are cross-sectional views of an embodiment of a device 100 of the present disclosure along the line A-A' in FIG. 1A constructed at various fabrication stages according to some embodiments of the present disclosure.

Figure 3:
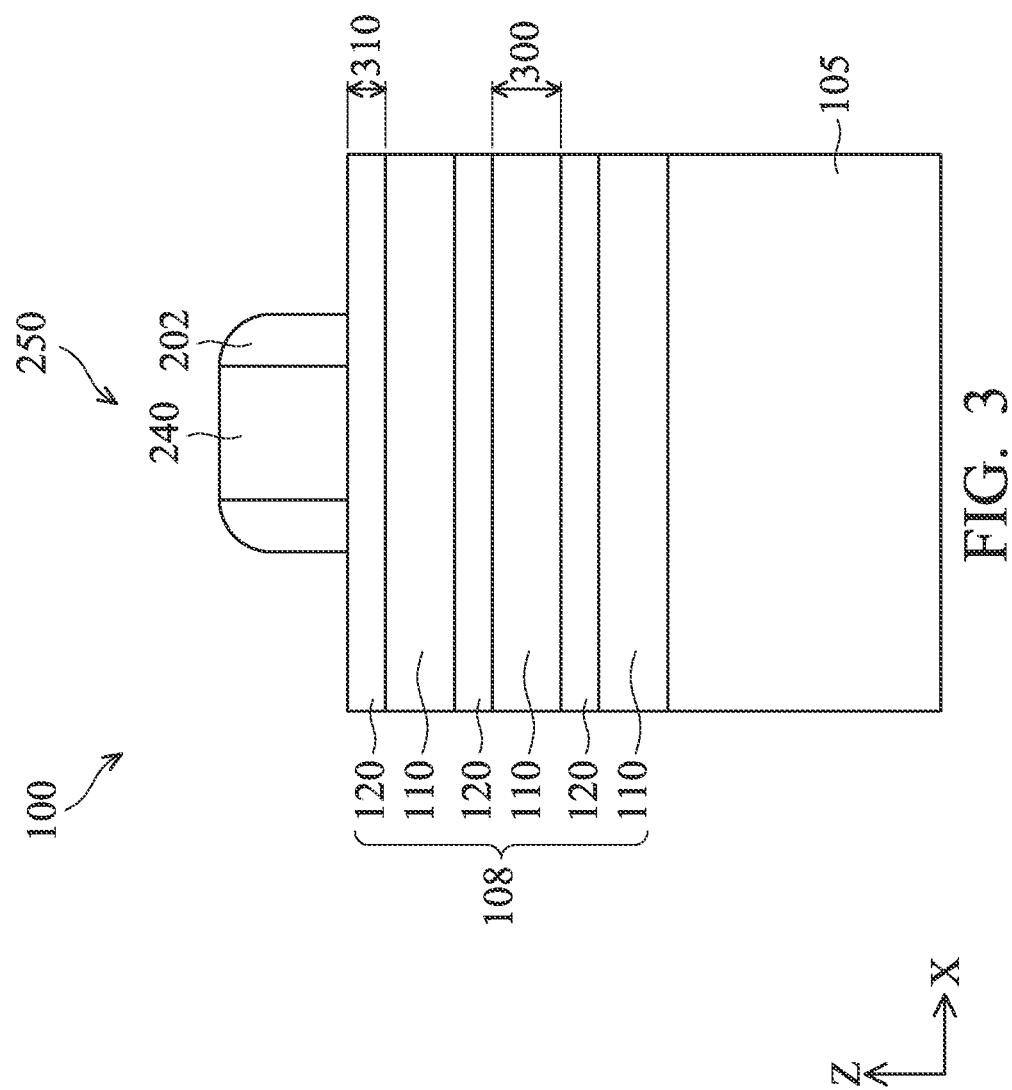
FIGS. 3, 4, 5, 6, 7, 8, 9, 10, 11, 12, 15, and 16 are cross-sectional views of embodiments of a device of the present disclosure along the line A-A' in FIG. 1A constructed at various fabrication stages according to some embodiments of the present disclosure.
Figure 4:
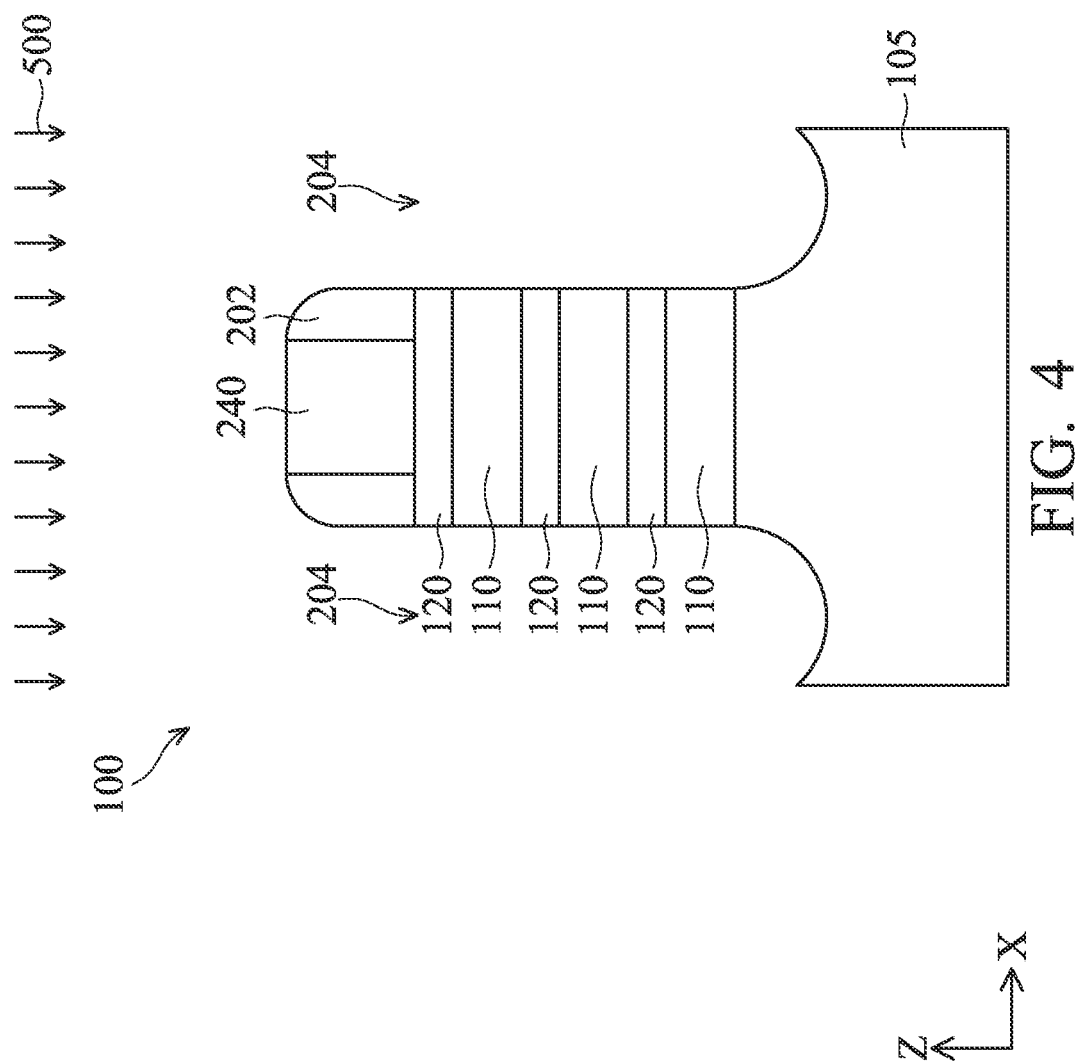

Referring to block 12 of FIG. 2 and FIG. 3, a semiconductor workpiece 100 (interchangeably referred to as the device 100) is received. The semiconductor workpiece 100 includes a substrate 105. The substrate 105 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 105 may also include a semiconductor-on-insulator substrate, such as Si-on-insulator (SOI), SiGe-on-insulator (SGOI), Ge-on-insulator (GOI) substrates. In the depicted embodiments (although not so limited), as described below, the semiconductor workpiece 100 is processed into a nanosheet-based device 100. Accordingly, stacks of semiconductor layers are formed over the substrate 105. The stacks of semiconductor layers include semiconductor layers 110 and semiconductor layers 120 alternating with each other. For example, a semiconductor layer 110 is formed over the substrate 105; a semiconductor layer 120 is formed over the semiconductor layer 110; and another semiconductor layer 110 is formed over the semiconductor layer 120, so on and so forth. In some embodiments, epitaxial growth of semiconductor layers 110 and semiconductor layers 120 is achieved by a molecular beam epitaxy (MBE) process, a chemical vapor deposition (CVD) process, a metalorganic chemical vapor deposition (MOCVD) process, other suitable epitaxial growth process, or combinations thereof. In such embodiments, semiconductor layers 110 and semiconductor layers 120 can be referred to as epitaxial layers.

As described further below, semiconductor layers 120 or portions thereof form channel regions of device 100, and semiconductor layers 110 are replaced by other features of the device. In the depicted embodiment, the semiconductor layer stack includes three semiconductor layers 110 and three semiconductor layers 120, configured to form three semiconductor layer pairs disposed over substrate 105. After undergoing subsequent processing, such configuration will result in the device 100 having three channel layers (or channels). However, the present disclosure contemplates embodiments where semiconductor layer stack includes more or fewer semiconductor layers, for example, depending on a number of channels desired for device 100 or design requirements of device 100. For example, the semiconductor layer stack can include two to ten semiconductor layers 110 and two to ten semiconductor layers 120. In the depicted embodiment, the semiconductor layers 110 each have a substantially uniform thickness, referred to as the thickness 300, while the semiconductor layers 120 each have a substantially uniform thickness, referred to as the thickness 310. The thickness 310 may be the same as, or different from, the thickness 300. The thickness 300 and thickness 310 are chosen based on fabrication and/or device performance considerations for device 100. For example, thickness 310 can be configured to achieve desired thickness of channels of device 100, thickness 300 can be configured to define a desired distance (or gap) between adjacent channels of device 100 (e.g., between semiconductor layers 120). Both thickness 300 and thickness 310 can be configured to achieve desired performance of device 100. In some embodiments, thickness 300 may be about 3 nm to about 15 nm; and thickness 310 may be about 3 nm to about 15 nm. In the depicted embodiment, the semiconductor layers 110 contain silicon germanium (SiGe), while the semiconductor layers 120 contain silicon (Si).

Still referring to FIG. 3 and to block 14 of FIG. 2, the stacks of semiconductor layers are patterned into a plurality of fin structures, for example, fin structures 108, such that they each have a width dimension along the Y-direction, a height dimension along the Z-direction, and each extending along and have a length dimension along the X-direction. The fin structures 108 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 108 may have lateral widths that are the same between each other or different from each other.

Still referring to FIG. 3 and to block 16 of FIG. 2, gate structures 250 are formed over a portion of each of the fin structures 108. In some embodiments, the gate structures 250 are also formed over the isolation features 150 in between adjacent fin structures. The gate structures 250 may be configured to extend lengthwise in parallel to each other, for example, each along the Y-direction. In some embodiments, the gate structures 250 each wrap around the top surface and side surfaces of each of the fin structures 108. In the depicted embodiments, the gate structures 250 includes dummy gate stacks 240 and gate spacers 202. The dummy gate stacks 240 may include polysilicon or any other suitable materials. In some embodiments, the gate structures 250 also include one or more mask layers (not shown), which are used to pattern the dummy gate stacks 240. The dummy gate stacks 240 may undergo a gate replacement process through subsequent processing to form metal gates, such as a high-k metal gate, as discussed in greater detail below. The dummy gate stacks 240 may be formed by a procedure including deposition, lithography, patterning, and etching processes. The deposition processes may include CVD, ALD, PVD, other suitable methods, and/or combinations thereof.

Gate spacers are formed on the sidewalls of the dummy gate stacks 240 and the top layer of the semiconductor layers 120. Although FIG. 3 depicts a single-layer gate spacer, in some embodiments, additional gate spacers (such as gate spacer 201, FIG. 1B) may be formed to collectively form multi-layer gate spacers. The gate spacer 202 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacer 202 may have a thickness in the range of a few nanometers (nm). In some embodiments, the gate spacer 202 may be formed by depositing a spacer layer (containing the dielectric material) over the dummy gate stack 240, followed by an anisotropic etching process to remove portions of the spacer layer from the top surfaces of the dummy gate stacks 240. After the etching process, portions of the spacer layer on the sidewall surfaces of the dummy gate stacks 240 substantially remain and become the gate spacer 202. In some embodiments, the anisotropic etching process is a dry (e.g. plasma) etching process. Additionally or alternatively, the formation of the gate spacer 202 may also involve chemical oxidation, thermal oxidation, ALD, CVD, and/or other suitable methods.

Processing continues to form source/drain trenches 204. Referring to block 18 of FIG. 2 and to FIG. 4, portions of the fin structure 108 adjacent to and exposed by the gate structures 250 (e.g. in the source/drain regions 108a) are at least partially recessed (or etched away) in process 500 to form the source/drain trenches 204. Meanwhile, the portions of the fin structure 108 underneath the gate structures 250 remain intact. Additional mask elements (not shown) may also be employed to protect areas not designed to be removed during the process 500. In the depicted embodiment, the etching process removes not only the exposed portions of fin structure 108, but also a portion of the underlying substrate 105. Accordingly, the source/drain trenches 204 extends below the top surface of the substrate 105. In some embodiments (not shown), the etching process removes all the exposed portions of the fin structure 108 but no further into the substrate, such that the top surface of the substrate 105 is exposed in the source/drain trenches 204. In other words, the source/drain trenches 204 extend to a depth along the top surface of the substrate 105. In some other embodiments (not shown), the etching process removes only some, but not all, of the fin structure 108 adjacent the gate structures 250, such that the substrate 105 is not exposed in the source/drain trenches 204. Accordingly, the source/drain trenches 204 extends to a depth above the top surface of the substrate 105. In some embodiments, the depth of the source/drain trenches 204 may be chosen by balancing the desired operational current and the tolerance for OFF-state leakage current in the subchannel regions. The etching process may include multiple lithography and etching steps, and may use any suitable methods, such as dry etching and/or wet etching.

The formation of the source/drain trenches 204 exposes sidewalls of the stack of semiconductor layers 110 and 120. Referring to block 20 of FIG. 2 and to FIG. 5, portions of the semiconductor layers 110 are removed through the exposed sidewall surfaces in the source/drain trenches 204 via a selective etching process. The selective etching process recesses the semiconductor layers 110 in a lateral direction along the X-direction and thus can be referred to as lateral etching process or lateral recessing process. The lateral etching process is designed to remove portions of the semiconductor layers 110 but only minimally affect (or not affect) the semiconductor layers 120. For example, two side portions (or interchangeably referred to as end portions) of the semiconductor layers 110 may be removed while the side portions of the semiconductor layers 120 directly above and below are substantially preserved. In other words, openings are formed between vertically adjacent side portions of the semiconductor layers 120. The selective etching process may be any suitable processes. As described above, in the depicted embodiment, the semiconductor layers 120 include Si and the semiconductor layers 110 include SiGe. The lateral etching process may be a wet etching process, such as a Standard Clean 1 (SC-1) solution. The SC-1 solution includes ammonia hydroxide ($NH_4OH$), hydrogen peroxide ($H_2O_2$), and water ($H_2O$). The SiGe-based semiconductor layers 110 may be etched away in the SC-1 solution at a substantially faster rate than the Si-based semiconductor layers 120. The etching duration is adjusted such that the size of the removed portions of SiGe layers is controlled. As a result, desired portions of the semiconductor layers 110 are removed while the semiconductor layers 120 are only minimally affected (or not affected). The optimal condition may be reached by additionally adjusting the etching temperature, dopant concentration, as well as other experimental parameters.

Figure 5:
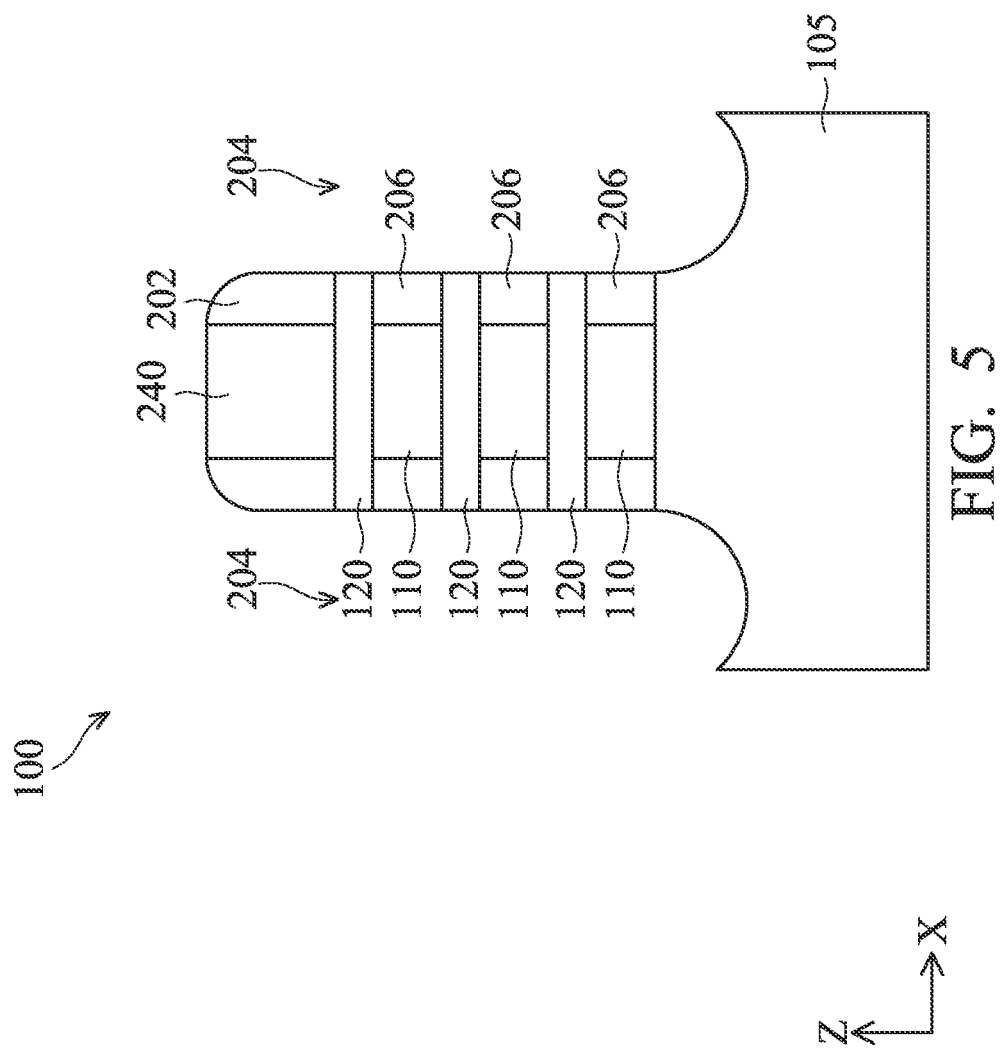

Still referring to FIG. 5 and to block 22 of FIG. 2, a dielectric material is deposited into both the source/drain trenches 204 and the openings formed between the adjacent semiconductor layers 120. The dielectric material may be selected from silicon oxide ($SiO_2$), silicon oxynitride (SiON), silicon oxycarbide (SiOC), silicon oxycarbonitride (SiOCN), or combinations thereof. In some embodiments, the proper selection of the dielectric material may be based on its dielectric constant (as described later). The deposition of the dielectric material may be any suitable methods, such as CVD, PVD, PECVD, MOCVD, ALD, PEALD, or combinations thereof. Subsequently, the dielectric material is partially etched back to restore the source/drain trenches 204. Meanwhile, the dielectric materials within the openings substantially remain and become the inner spacers 206. Accordingly, the inner spacers 206 are formed between vertically adjacent semiconductor layers 120 and on sidewall surfaces of the etched semiconductor layers 110. In an embodiment, the etching-back is a self-aligned anisotropic dry-etching process, such that the gate spacer 202 is used as the masking element. Alternatively, a different masking element (e.g. a photoresist) may be used.

Figure 6:
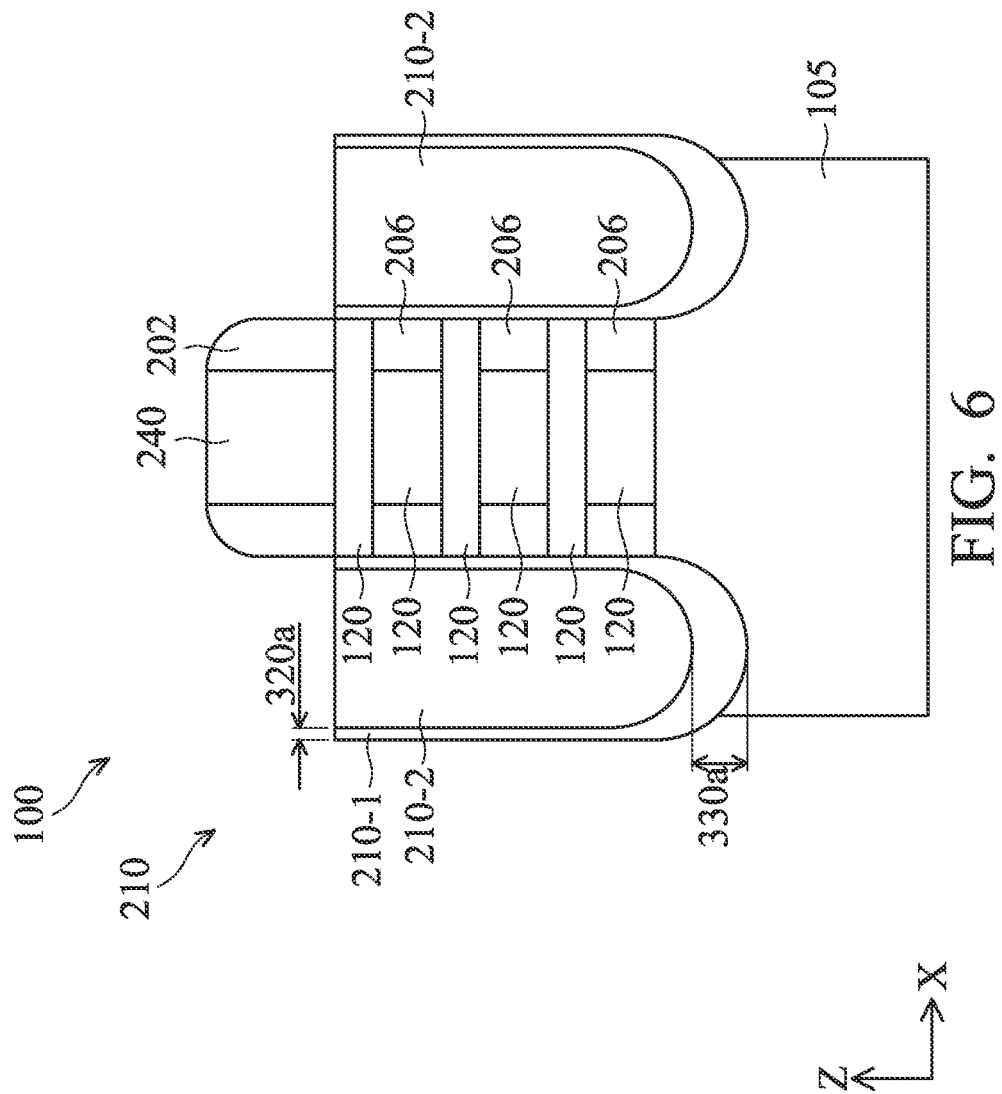

Referring to block 24 of FIG. 2 and to FIG. 6, epitaxial source/drain layers 210 are formed in the source/drain trenches 204. Accordingly, the epitaxial source/drain layers 210 interface with and directly contact the inner spacers 206, the semiconductor layers 120, and the top surface of the substrate 105. Multiple processes, including etching and growth processes, may be employed to grow the epitaxial source/drain layers 210. In the depicted embodiment, the epitaxial source/drain layers 210 have top surfaces that extend along the top surface of the topmost semiconductor layer 120. However, in other embodiments, the epitaxial source/drain layers 210 may alternatively have top surfaces that extend above or below the top surface of the topmost semiconductor layer 120. In some embodiments, the epitaxial source/drain layers 210 may merge together, for example, along the Y-direction (see e.g., FIG. 1A), to provide a larger lateral width than an individual epitaxial source/drain feature.

In the depicted embodiments, the epitaxial source/drain layers 210 are configured to be part of the PMOS transistor. Accordingly, the epitaxial source/drain layers 210 may include any suitable p-type semiconductor materials, such as Si, SiGe, Ge, SiGeC, or combinations thereof. In the depicted embodiments, the epitaxial source/drain layers include SiGe. The SiGe epitaxial source/drain layers 210 assert a compressive stress on the Si semiconductor layers 120. As described above, such compressive stress reduces resistance within the channel layers. The epitaxial source/drain layers 210 may further be doped in-situ or ex-situ. For example, the epitaxially grown SiGe source/drain features of a PMOS may be doped with boron (B) to form Si:Ge:B source/drain features. In some embodiments, the epitaxial source/drain layers 210 may include a plurality of layers. For example, the epitaxial source/drain layers 210 may include a sublayer 210-1 adjacent and contacting the semiconductor layers 120 that is free of any dopants, and another sublayer 210-2 remote from the semiconductor layers 120 that includes B dopants. In some embodiments, this configuration allows minimizing the interface resistance between the epitaxial source/drain layers 210 with subsequently formed silicide layer, without jeopardizing channel performances during operation. In the depicted embodiments, the sublayer 210-1 includes two side arms on outer surfaces of the epitaxial source/drain layers 210 and a bottom section that connects the two side arms. The side arms of the sublayer 210-1 has a thickness 320a along the X-direction; and bottom sections of the sublayer 210-1 has a thickness 330a along the Z-direction. In some embodiments, the thickness 320a is about 1 nm to about 8 nm; and the thickness 330a is about 1 nm to about 15 nm. If the thickness 320a is too small, such as less than about 1 nm, there may be a current crowding issue that degrades the performance. Where dopants are implemented, one or more annealing processes may be performed to activate the dopants in the epitaxial source/drain layers 210 (such as in the sublayer 210-2). The annealing processes may comprise rapid thermal annealing (RTA) and/or laser annealing processes. At this processing stage, each pair of epitaxial source/drain layers 210 are connected by multiple semiconductor layers 120, which serve as the carrier conduits between the epitaxial source/drain layers 210 during the operation.

Figure 7:
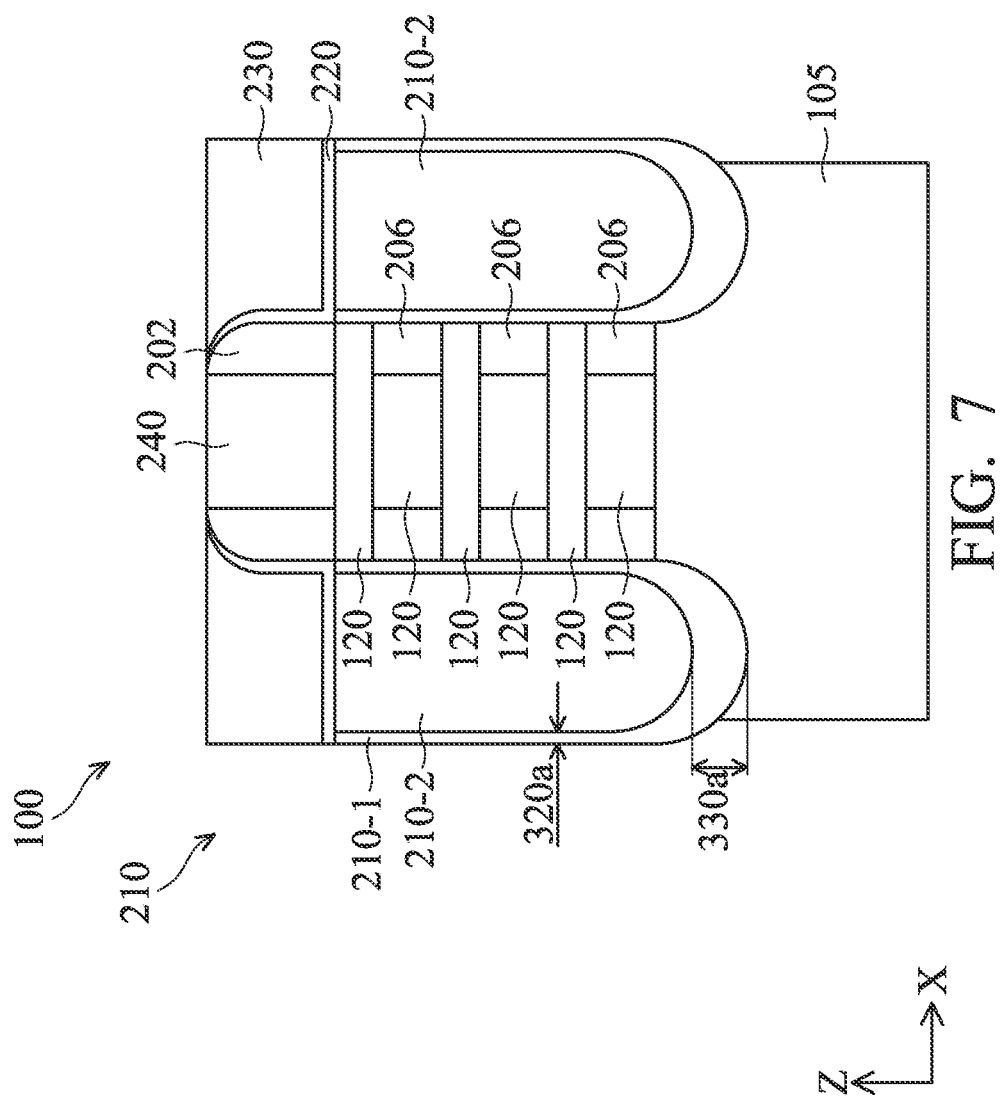

Referring to block 26 of FIG. 2 and to FIG. 7, an ILD layer 230 is formed over the epitaxial source/drain layers 210, as well as over the isolation features 150 (see FIG. 1A). The ILD layer 230 may also be formed in between the adjacent gate structures 250 along the X-direction, and in between the adjacent epitaxial source/drain layers 210 along the Y-direction. The ILD layer 230 may include a dielectric material, such as a high-k material, a low-k material, or an extreme low-k material. For example, the ILD layer 230 may include $SiO_2$, SiOC, SiON, or combinations thereof. The ILD layer 230 may include a single layer or multiple layers, and may be formed by a suitable technique, such as CVD, ALD, and/or spin-on techniques. After forming the ILD layer 230, a CMP process may be performed to remove excessive ILD layer 230 and planarized the top surface of the ILD layer 230. Among other functions, the ILD layer 230 provides electrical isolation between the various components of the device 100. In some embodiments, a contact etch stop layer 220 is formed, prior to the forming of the ILD layer 230, over the epitaxial source/drain layers 210, as well as gate spacer 202. The etch-stop layer protects various device features from subsequent etching processes.

Figure 8:
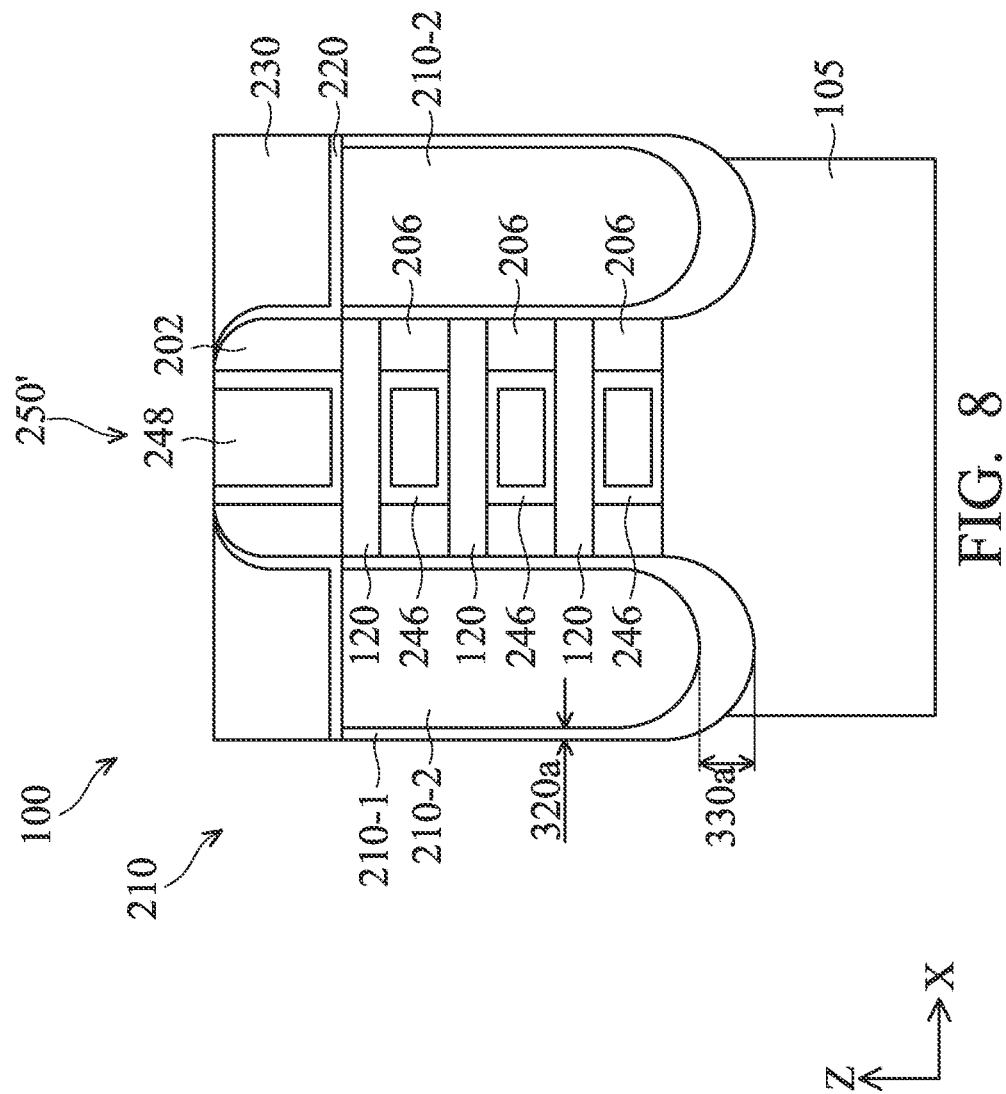

Referring to block 28 of FIG. 2 and to FIG. 8, the dummy gate stacks 240 are selectively removed from the gate structures 250 to form gate trenches, which expose the respective top and side surfaces of the semiconductor stacks (along the Y direction). The selective removal process may be selected from any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate stacks 240. Then, the dummy gate stacks 240 are selectively etched through the masking element. In some other embodiments, the gate spacer 202 may be used as the masking element or a part thereof.

Still referring to FIG. 8 and block 28 of FIG. 2, the remaining portions of the semiconductor layers 110 are selectively removed through the exposed side surfaces of the semiconductor layers 120. The removal of the remaining portions of the semiconductor layers 110 form suspended semiconductor layers 120, as well as additional openings in between the vertically adjacent layers. Accordingly, the center portions of the semiconductor layers 120 each have exposed top and bottom surfaces. In other words, the center portions of each of the semiconductor layers 120 are now exposed circumferentially around the X-direction. This removal processes may be any suitable etching processes. In addition to exposing top and bottom surfaces of the center portions of the semiconductor layers 120, these processes also expose the sidewall surfaces of the inner spacers 206.

Subsequently, referring to FIG. 8 and to block 30 of FIG. 2, a metal gate stack is formed in the gate trenches and openings between adjacent semiconductor layers 120. In other words, the metal gate stack replaces the dummy gate stack 240 and, collectively with the gate spacer 202, forms the new gate structure 250'. The metal gate stack may include a plurality of layers, such as the gate dielectric layer 246 and the conductive metal layer 248. For example, a gate dielectric layer 246 is formed over and wrapping each of the semiconductor layers 120, and the conductive metal layer 248 is formed over and wrapping the portions of the gate dielectric layers 246. The conductive metal layer 248 further fills any remaining open spaces within the gate structures 250'. In some embodiments, the gate dielectric layer 246 further includes multiple layers. For example, the gate dielectric layer 246 may include a high-k dielectric layer. The high-k gate dielectric layer may be formed conformally. In some embodiments, the high-k gate dielectric layer may be formed around the exposed surfaces of each of the semiconductor layers 120, such that it wraps around each of the semiconductor layers 120 in 360 degrees. The high-k gate dielectric layer may further be formed over the side surfaces of the inner spacers 206, and the gate spacer 202. The high-k gate dielectric layer may contain a dielectric material having a dielectric constant greater than a dielectric constant of $SiO_2$, which is approximately 3.9. For example, the high-k gate dielectric layer may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layers may be by any suitable processes, such as CVD, PVD, ALD, or combinations thereof.

In some embodiments, the gate dielectric layer 246 further includes an interfacial layer. The interfacial layer is formed between the semiconductor layers 120 and the high-k dielectric layer. Any suitable methods may be used to form the interfacial layer, such as ALD, CVD, or other deposition methods. Alternatively, the interfacial layer may also be formed by an oxidation process, such as thermal oxidation or chemical oxidation. In this instance, no interfacial layer is formed on the sidewalls of the inner spacers 206 or the gate spacer 202. In many embodiments, the interfacial layer improves the adhesion between the semiconductor substrate and the subsequently formed high-k dielectric layer. However, in some embodiments, the interfacial layer is omitted. The conductive metal layer 248 is formed over the gate dielectric layer 246 and fills the remaining spaces of the gate trenches and the openings between adjacent semiconductor layers 120. In some embodiments, the conductive metal layer 248 may include a work function layer wrapping around the gate dielectric layer 246 and a fill metal layer on the work function layer. In some embodiments, the work function metal layer may include titanium nitride (TiN), ruthenium (Ru), iridium (Ir), osmium (Os), rhodium (Rh), or combinations thereof. The conductive metal layer 248 may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof.

In some embodiments, the formation of metal gate stack secures the channel layers 120 and, in conjunction with the source/drain layers 210 (or sublayers thereof), ensures the stress asserted thereon (for example, by the SiGe source/drain layers 210 described above) are not relaxed during subsequent processing operations. In some approaches, the metal gate stacks are formed at a later processing stage. In other words, at the present processing stage, the dummy gate stack 240 having polysilicon still occupy the gate trenches and openings between semiconductor layers 120. In such approaches, because polysilicon has lower rigidity than the metal gate stack, the stresses asserted on the semiconductor layers 120 are more easily relaxed due to molecular movement and lattice reorganization against the polysilicon. Accordingly, the stresses achieved from the epitaxial source/drain layers 210 may be challenging to retain, and resistance reduction benefits described above are reduced or offset.

Figure 9:
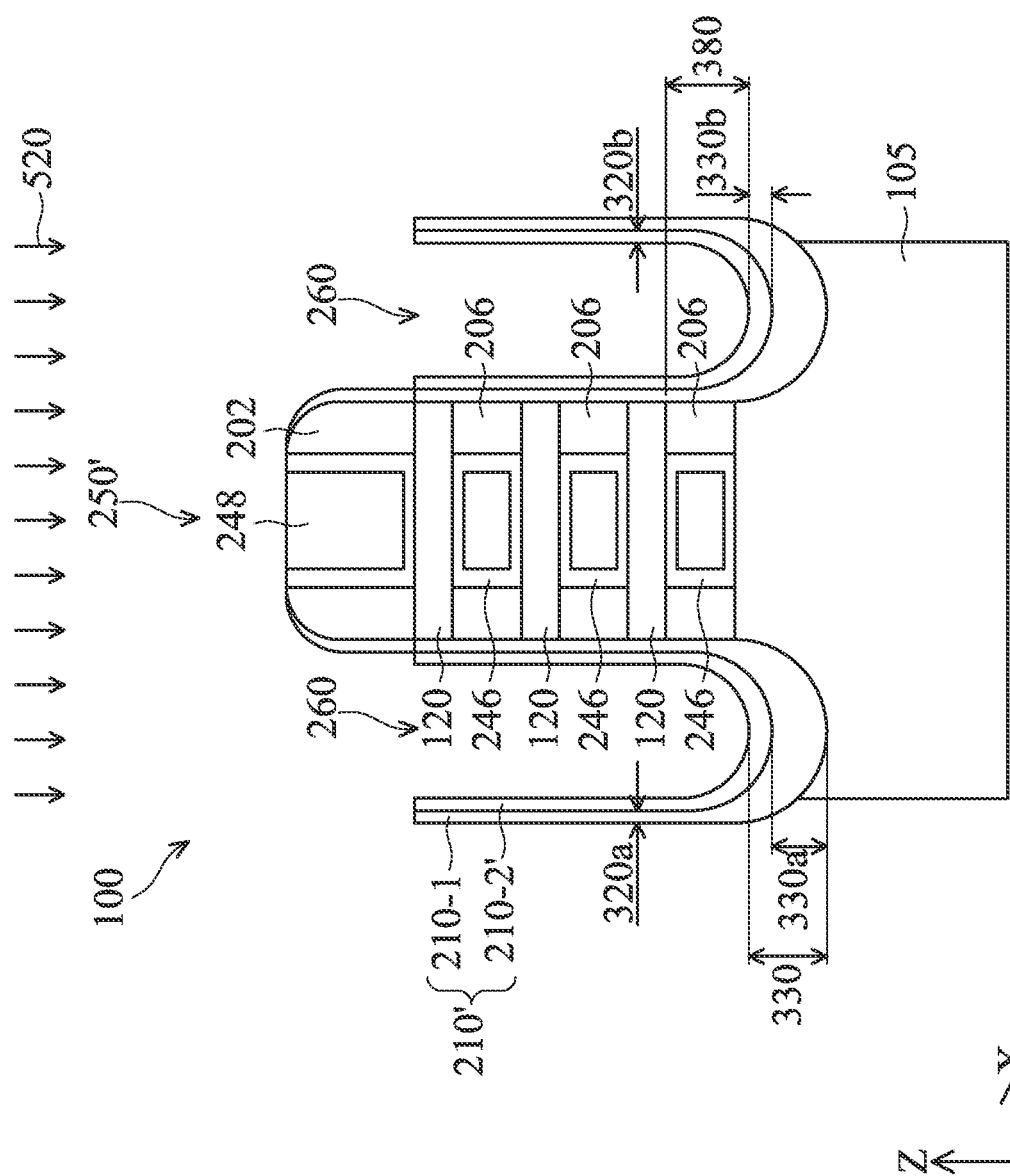

Referring to FIG. 9 and block 32 of FIG. 2, an etching process 520 is implemented to remove a portion of the source/drain layers 210 so as to form new source/drain trenches 260. For example, a majority portion (e.g., greater than 50% by volume) of the sublayer 210-2 is removed, leaving a thin layer 210-2' interfacing with the substrate 105, the semiconductor layers 120, and the inner spacers 206. The remaining sublayer 210-2' and the sublayer 210-1 collectively form the etched epitaxial source/drain layer 210'. As described above, the etched epitaxial source/drain layer 210' and the metal gate stack 250' collectively serve to retain the stress within the channel layers 120. In some embodiments, the sublayer 210-2' and the etched epitaxial source/drain layer 210' each has a profile resembling the letter "U". In other words, the sublayer 210-2' includes two side arms interfacing with the semiconductor layers 120 and the inner spacers 206, and a bottom section interfacing with the substrate 105 and connecting the two side arms. In some embodiments, the side arms of the sublayer 210-2' each has a lateral thickness 320b (along the X-direction); and the bottom section of the sublayer 210-2' has a vertical thickness 330b (along the Z-direction). Accordingly, the etched epitaxial source/drain layer 210' has a thickness 320 that is the sum of the thickness 320a of the sublayer 210-1 and the thickness 320b of the sublayer 210-2', for example, measuring from a vertical sidewall surface of the semiconductor layer 120 (for example, along the Z-direction) to a sidewall surface of the new source/drain trench 260 and across the lateral dimension of the layer 210. Moreover, bottom section of the etched epitaxial source/drain layer 210 has a vertical thickness 330 (along the Z-direction) that is the sum of the vertical thickness 330a and 330b.

In some embodiments, different sections of the side arms of the etched epitaxial source/drain layer 210' may have substantially uniform lateral thicknesses 320; and/or different sections of the bottom section of the etched epitaxial source/drain layer 210' may have substantially uniform vertical thickness 330. In other embodiments, however, the side arms of the etched epitaxial source/drain layer 210' and/or the bottom section of the etched epitaxial source/drain layer 210' may have varying thickness across their respective profiles. In such other embodiments, the lateral thickness 320 and the vertical thickness 330 each refer to the averaged thickness across their respective profiles. In some embodiments, the lateral thickness 320 may be about 2 nm to about 11 nm; and in some embodiments, the vertical thickness 330 may be less than about 15 nm. If the lateral thickness 320 is too small, the etched epitaxial source/drain layer 210' may not be sufficiently strong to retain the stress asserted by the epitaxial materials therein onto the semiconductor channels. Moreover, if the lateral thickness 320 is too small, such as less than about 4 nm, there may be insufficient amount of semiconductor material available to later form a silicide layer therefrom. In absence of this silicide layer, contact resistances between the source/drain feature and the semiconductor channels (e.g. the semiconductor layers 120) may not be minimized. Conversely, if the lateral thickness 320 is too large, such as greater than about 11 nm, and/or the vertical thickness 330 is too large, such as greater than about 15 nm, the high resistances within the source/drain features (as described above) may excessively contribute to the overall device resistance. Furthermore, in some embodiments, the entirety of the sublayer 210-2' is removed in the etching process 520. In other words, the lateral thickness 320b, the vertical thickness 330b, or both are zero.

Furthermore, in some embodiments, the source/drain trenches 260 have a bottom surface that extends below a bottom surface of the lowest semiconductor layer 120. For example, a distance between the bottom surface of the source/drain trenches 260 and the bottom surface of the lowest semiconductor layer 120 is the distance 380. In some embodiments, the distance 380 is about 1 nm to about 10 nm. As described later, source/drain layers are subsequently formed inside the source/drain trenches 260 and on the bottom surface of the source/drain trenches 260. If the bottom surface extends higher than the bottom surface of the lowest semiconductor layer 120, or if the distance 380 is too small, such as less than about 1 nm, such source/drain layers 262 do not extend deep enough to cover entire sidewall surfaces of the lowest semiconductor layers 120. This unnecessarily restricts the available amount of charge carriers that migrate through the channel layers (such as that migrates through the lowest channel layer) and restricts the overall device current level. Conversely, if the distance 380 is too large, such as greater than about 10 nm, leakage in the sub-channel region may increase and/or residual capacitance may increase. The etching process 520 may implement any suitable etching methods. In some embodiments, a photoresist is formed over the device 100. The photoresist may have openings exposing the portion of the source/drain layers 210 designed to be etched. Subsequently, a deep etching operation is conducted to remove the desired portion of the source/drain feature 210. For example, the deep etching operation of the etching process 520 may use a drying etching operation. In other embodiments, the etching process 520 may utilize the spacer 202 as a masking element.

Figure 10:
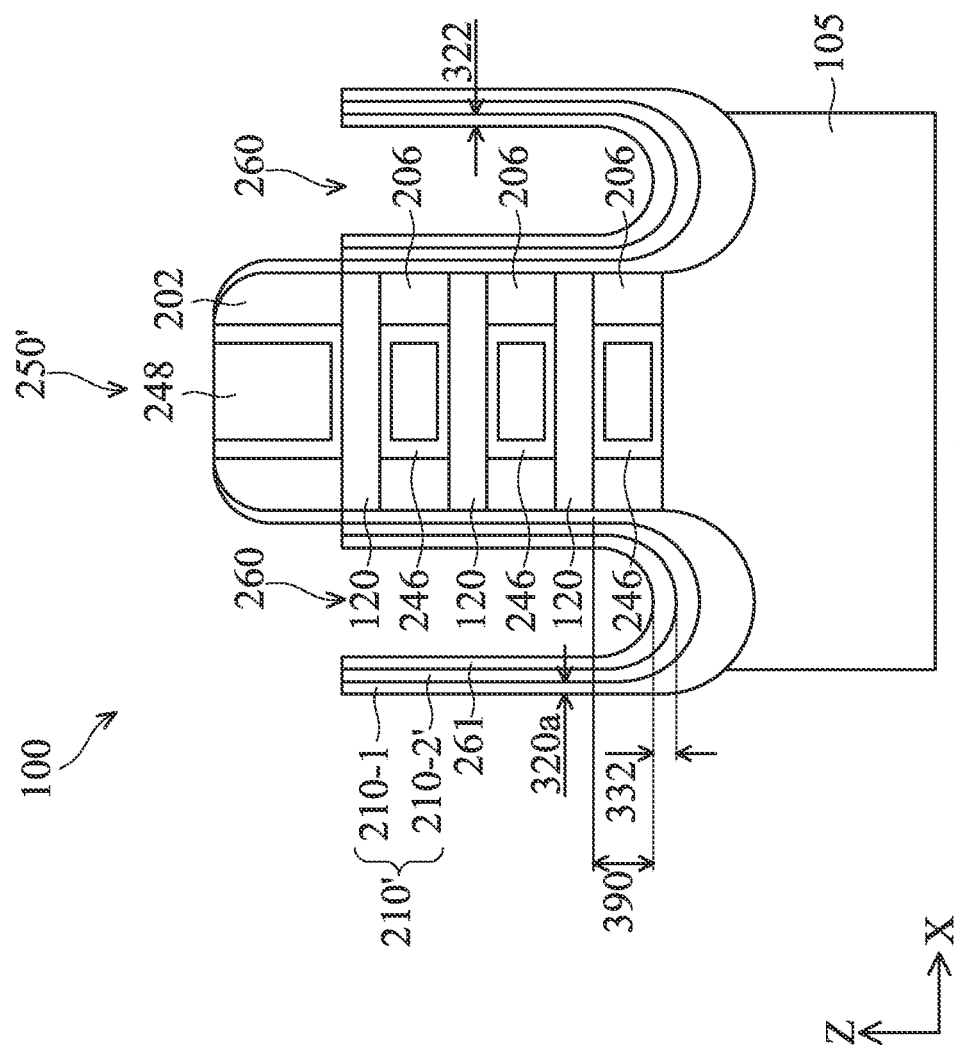

Referring to FIG. 10 and to block 34 of FIG. 2, a conductive material is deposited into the source/drain trenches 260 to form a conductive material layer 261 over the etched epitaxial source/drain layer 210', or more specifically, the sublayer 210-2'. The conductive material layer 261 directly interfaces with the sublayer 210-2' at the side and bottom surfaces. In some embodiments, the conductive material layer 261 includes a metal. The conductive material layer 261 may include a pure metal, a metal alloy or a metal with additives (e.g., C, Al, Sc, Ti, V, Cr, Mn, Fe, Cu, Y, Zr, Nb, Mo, Ru, Rh, Pd, In, Sn, La, Hf, Ta, W, Re, Jr, Pt, Ce, Pr, Nd, Sm, Eu, Gd, Th, Dy, Ho, Er, Tm, Yb, Lu and mixtures thereof). In some embodiments, the metal layer 261 includes titanium (Ti), nickel (Ni), cobalt (Co), or combinations thereof. As described below, the metal layer 261 is utilized to form a silicide layer (for example, a self-aligned silicide layer, or salicide layer) to help reducing interface resistances. In some embodiments, the metal layer 261 is blank deposited over the device 100. In some embodiments, the side arms of the conductive material layer 261 has a thickness 322; and portions of the conductive material layer 261 has a thickness 332. The formation of the conductive material layer 261 reduces the distance (distance 390) between the bottom surface of the source/drain trenches 260 and the bottom surface of the lowest semiconductor layers 120. In some embodiments, the bottom surface of the source/drain trenches 260 is still below the bottom surface of the lowest semiconductor layers 120. For example, the distance 390 may be about 1 nm to about 10 nm. If the bottom surface extends higher than the bottom surface of the lowest semiconductor layer 120, or if the distance 390 is too small, such as less than about 1 nm, subsequently formed source/drain layers 262 may not have sufficient volume to provide maximal amount of charge carriers to go through the lowest semiconductor layers 120 in operation. This unnecessarily restricts the overall device current level. On the other, the distance 390 is restricted by the magnitude of the distance 380 and may not exceed 10 nm.

Figure 11:
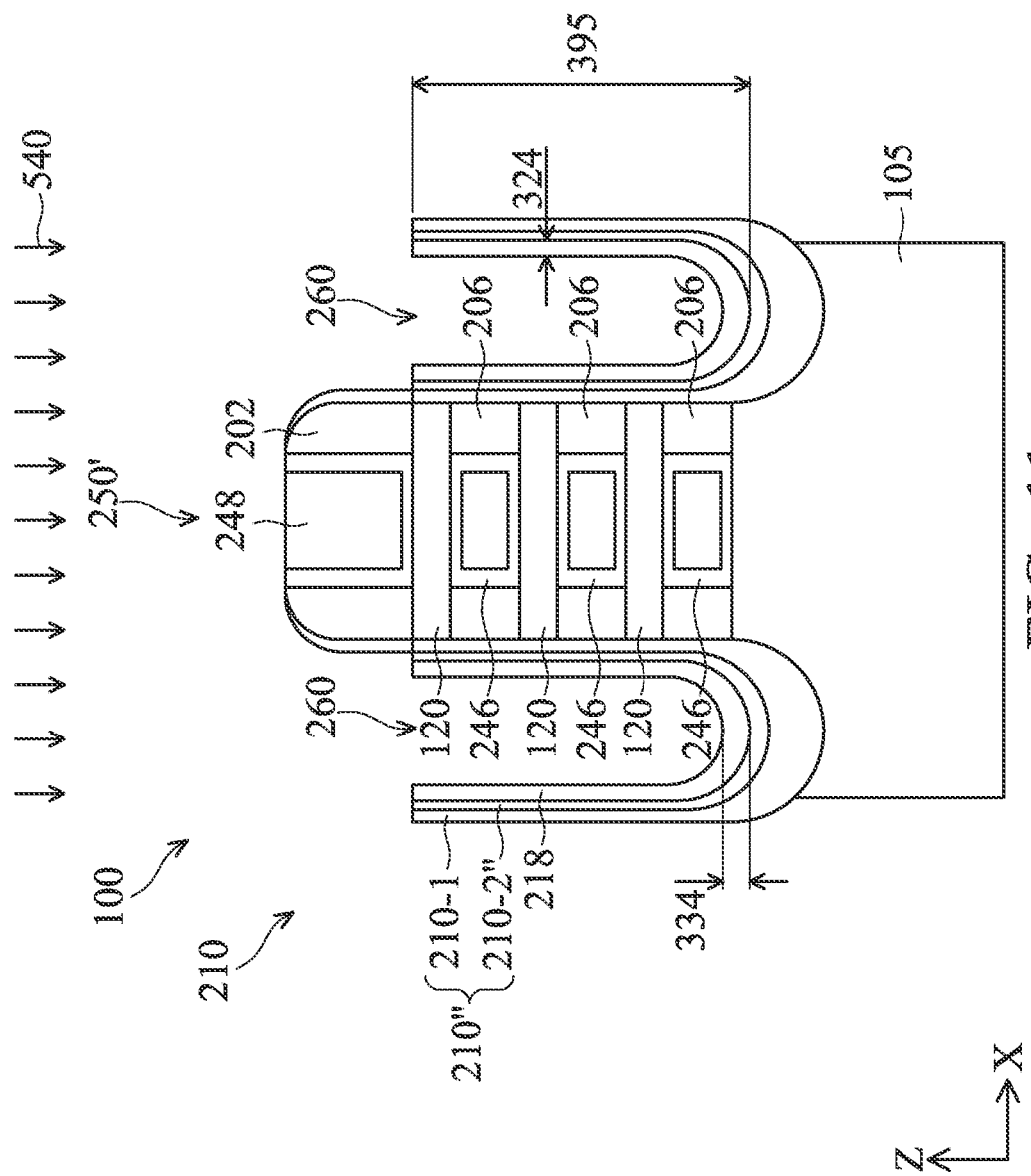

Referring to FIG. 11, the device 100 is annealed at a specified temperature in an annealing operation 540 to form a low-resistivity silicide layer 218. For example, a portion of the source/drain feature layer 210 (such as the layer 210-2' or portions thereof) interacts with the conductive material layer 261 at the annealing temperature to form silicide layer 218. The silicide layer promotes intermixing of materials of adjacent material layers and reduces the contact resistances thereof. The annealing operation 540 may be any suitable annealing operations, preferably a rapid thermal annealing step or steps. In some embodiments, the annealing temperature may be about 250° C. to about 700° C., and conducted for a time duration of about 30 s to about 100 s. Briefly, the silicide process is a phase transformation process. If the processing temperature is greater than the phase transformation temperature of a material, the original material phase will change to another phase. Different phases have different atomic arrangement and properties. In some embodiments, the conductive material layer 261 includes nickel. Nickel's first phase transformation temperature is about 250° C. At a temperature above 250° C., nickel will react with silicon to form NiSi. However, another phase transformation temperature for nickel is about 700° C. At a processing temperature above 700° C., NiSi will change to NiSi$_2$. Any temperature between about 250° C. and 700° C. could be the rapid thermal anneal (RTA) temperature to form NiSi. In general, NiSi is a more suitable phase of nickel silicide, because this form of silicide has lower resistivity than alternative nickel suicides. In some embodiments, the selected annealing temperature and annealing time duration of the annealing operation 540 are selected dependent upon the metal selected and the desired depth of the silicide layer formed thereby. For example, these parameters may be chosen based on the dimensions and profiles described. As a result of the annealing operation 540, at least a portion of the conductive material layer 261 and at least a portion of the layer 210' (such as the sublayer 210-2' or portions thereof) are converted into the silicide layer 218. In some embodiments, the entirety of the layer 210-2' is consumed during the process 540 and converted into the silicide layer 218 along with the layer 261. Moreover, in some embodiments, the entirety of the conductive material layer 261 is also consumed and the formation of the silicide layer 218. In some embodiments, not all of the conductive material layer 261 is consumed, and the unreacted portion of the conductive material layer 261 is removed prior to another conductive material layer (such as the layer 262) is deposited. However, in some embodiments, the removal process is omitted. In the depicted embodiments, only a portion of the sublayer 210-2' is consumed during the silicide reaction. Accordingly, sublayer 210-2" remains following the process 540. The sublayer 210-2" interposes the silicide layer 218 and the sublayer 210-1. The sublayer 210-1 and sublayer 210-2" collectively form the layer 210".

Subsequently, referring to FIG. 12 and to block 38 of FIG. 2, another conductive material layer 262 (or layer 262) is formed on the silicide layer 218 using any suitable deposition techniques. In some embodiments, the conductive material layer 262 serve as source/drain features for the device. Accordingly, the conductive material layer 262 is also interchangeable referred to as the source/drain layer 262. The conductive material layer 262 may include tungsten (W), cobalt (Co), ruthenium (Ru), other suitable metals, or combinations thereof. Because conductive materials have substantially lower resistances than semiconductor materials (such as SiGe), resistances within the source/drain features are substantially reduced as compared to other approaches. Moreover, the conductive material layer 262 may also serve the function of a local contact feature. Accordingly, separate operations to form the local contact features may not be needed.

Figure 12:
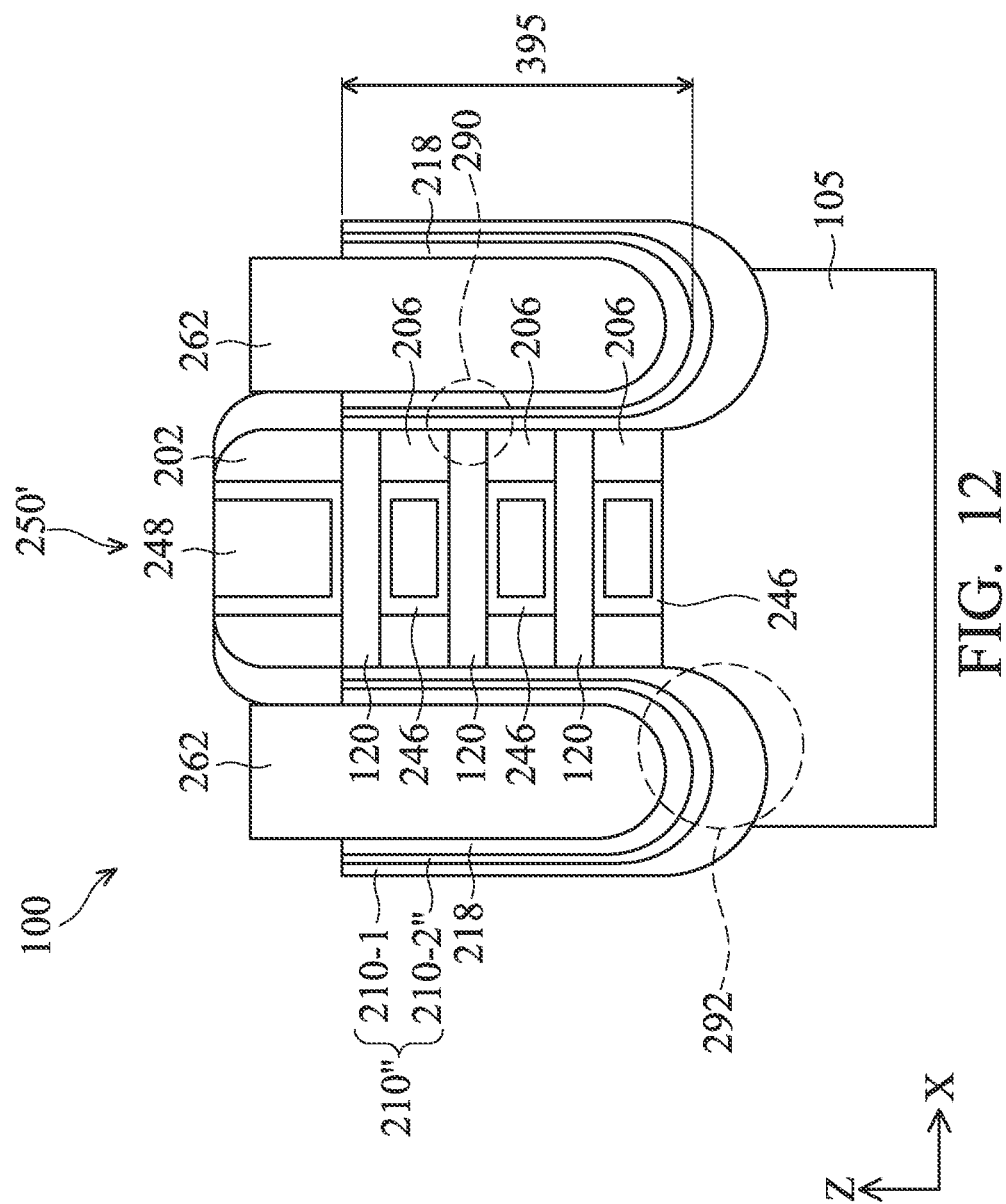

As illustrate in FIG. 12, in the depicted embodiments, the silicide layer 218 is formed interposing between the sidewall surfaces of each of the semiconductor layers 120 and the sidewall surfaces of the conductive material layer 262. For example, the silicide layer 218 extends over and covers the entirety of the sidewall surfaces of each of the semiconductor layers 120. Further, the silicide layer 218 extends over and wraps around the entirety of the conductive material layer 262, which serves as the source/drain features of the device. In operation of the device, charge carriers migrate between the source/drain features and the channel layers through their respective sidewall surfaces. Accordingly, contact resistances at each of these sidewall surfaces (or interfaces) contribute to the overall device resistance. Having all such sidewall surfaces covered by the silicide layer 218 substantially reduce such contact resistances. In some embodiments, the silicide layer 218 has a height 395 along the Z-direction. A ratio of the height 395 to the thickness 310 of the semiconductor layers 120 may be about 5:1 to about 15:1. In some embodiments, the ratio may be about 7:1 to about 10:1. If the ratio is too small, the depth of the new source/drain trenches 260 may be too shallow such that the resistances within the source/drain features are not minimized. If the ratio is too large, either the channel layer may be too small such that channel resistance may be too high, or the new source/drain trenches 260 may be too deep such that residual capacitance therein may become excessively high.

In the depicted embodiments, the sidewall surfaces of the silicide layer 218 extends along or in parallel to the sidewall surfaces of the semiconductor layers 120 and along or in parallel to the sidewall surfaces of the inner spacers 206. For example, the sidewall surfaces of the silicide layer 218 extend substantially vertically and perpendicular to a top surface of the substrate and a top surface of the semiconductor layers. It is noted that the present disclosure also contemplates situations where the sidewall surfaces of the semiconductor layers 120 and/or the inner spacers 206 have curved surfaces, and the silicide layer 218 generally and approximately conforms to the profile of their sidewall surface profile but not necessarily along any specific directions.

In some approaches not implementing methods of the present disclosure, the silicide layer may not conform to the sidewall surfaces of the semiconductor layers 120. Rather, in such approaches, the silicide layer may be formed on top surfaces of the source/drain feature that occupy the entirety of the source/drain trenches 204 (see FIG. 5). For example, the ratio of the height 395 of the silicide layer may be substantially less than that described here. Accordingly, such silicide layer extends between the source/drain features and subsequently formed local contact features, but do not extend between each of the semiconductor layers and the source/drain features.

FIGS. 13 and 14 illustrate further details of the device 100 of FIG. 12. For example, the portion 290 of FIG. 12 is illustrated in expanded side view in FIG. 13, and the portion 292 of FIG. 12 is illustrated in expanded side view of FIG. 14. Referring to FIG. 13, as described above the silicide layer 218 directly interfaces with the conductive material layer 262. Moreover, the silicide layer 218 directly interfaces with the epitaxial material layer 210". For example, as illustrated in FIG. 13, the epitaxial layer 210" includes a first sublayer 210-1 formed to directly interfacing with the semiconductor layer 120 and the inner spacers 206, and a second sublayer 210-2" formed on and directly interfacing with the first layer 210-1. The second layer 210-2" further directly interfaces with the silicide layer 218. In some embodiments, the epitaxial layer 210" has a lateral thickness 302. In some embodiments the lateral thickness 302 is less than about 5 nm. If the lateral thickness 302 is too large, such as larger than 5 nm, the contribution of the silicide layer 218 towards the of the overall contact resistance between the semiconductor layers 120 and the layer 262 may be diluted. Accordingly, the resistance reduction benefit described above associated with the implementation of silicide layer 218 may not be maximized. In some embodiments, the epitaxial layer 210" does not include the sublayer 210-2". For example, the entirety of the sublayer 210-2' has been consumed in the silicide reaction with the conductive material layer 261 during the annealing operation 540. Furthermore, the side arms of the silicide layer 218 (e.g. that adjacent the sidewall surfaces of the semiconductor layer 120) has a lateral dimension 304. In some embodiments, the lateral dimension 304 is about 4 nm to about 6 nm. Generally, a thinner layer of silicide layer is more resistive than a thicker silicide layer of the same material. If the lateral dimensions 304 is too small, such as less than 4 nm, the effectiveness of the silicide layer 218 reducing the contact resistance may be diminished. Conversely, if the lateral dimension 304 is too large, such as larger than 6 nm, junction leakages may become a significant challenge. In some embodiments, the sum of the lateral thickness 302 and the lateral thickness 304 may be similar to the sum of the thickness 320 and the thickness 322.

In some embodiments, referring to FIG. 14, the sublayers 210-1 and 210-2" each extend to the surface of the substrate 105. In the depicted embodiment, the sublayers 210-1 and 210-2" collectively has a thickness 312. Moreover, the silicide layer 218 similarly extends to the surface of the substrate 105, and has a thickness 314. In some embodiments, the thickness 312 is less than about 15 nm; and the thickness 314 is about the same as the thickness 304. If the lateral thickness 312 is too large, such as larger than 15 nm, the contribution of the silicide layer 218 towards the of the overall contact resistance between the semiconductor layers 120 and the layer 262 may be diluted. Accordingly, the resistance reduction benefit described above associated with the implementation of silicide layer 218 may not be maximized. In some embodiments, no portions of layer 210 remain following the annealing operation 540. In other words, the thickness 312 is zero. If the lateral dimensions 314 is too small, such as less than 4 nm, the effectiveness of the silicide layer 218 reducing the contact resistance may be diminished. Conversely, if the lateral dimension 314 is too large, such as larger than 6 nm, junction leakages may become significant challenge. In some embodiments, the sum of the lateral thickness 312 and the lateral thickness 314 may be similar to the sum of the thickness 330 and the thickness 332.

As described above, in the depicted embodiments, the conductive material layers 262 (which serves as the source/drain features) further serve as the local contact for the source/drain features. For example, via features are later formed to connect to the source/drain layers 262 directly. In other embodiments, additional contact features may be formed over the top surfaces of the conductive material layers 262. The method 10 may continue to form additional features and complete the fabrications of the device 100. For example, other contact features, via features, or metal line features may be formed for the device 100. Processing steps may be added to or eliminated from the method 10 before or after any of the described steps. Additional steps can be provided before, during, and after the method 10, and some of the steps described may be replaced or eliminated, for additional embodiments of the method. It is further understood that additional features can be added in the device 100, and some of the features described may be replaced or eliminated, for additional embodiments of the device 100. For example, FIGS. 10-12 provides embodiments where annealing operation 540 is conducted following the formation of the conductive material layer 261 but before the formation of the conductive material layer 262. Alternatively, in some embodiments, the annealing operation 540 may be conducted after the formation of the metal layer 262, for example, conducted with the metal layer 262 over the metal layer 261. In other words, following the processing stage associated with FIG. 10, the method 10 alternatively proceeds to form the conductive material layer 262 over the conductive material layer 261. And the annealing operation 540 is conducted after the formation of the conductive material layer 262. In such embodiments, the deposition of the layer 261 and the layer 262 may be a single deposition operation or multiple deposition operations. In some embodiments, the layers 261 and 262 include the same conductive material.

Figure 15:
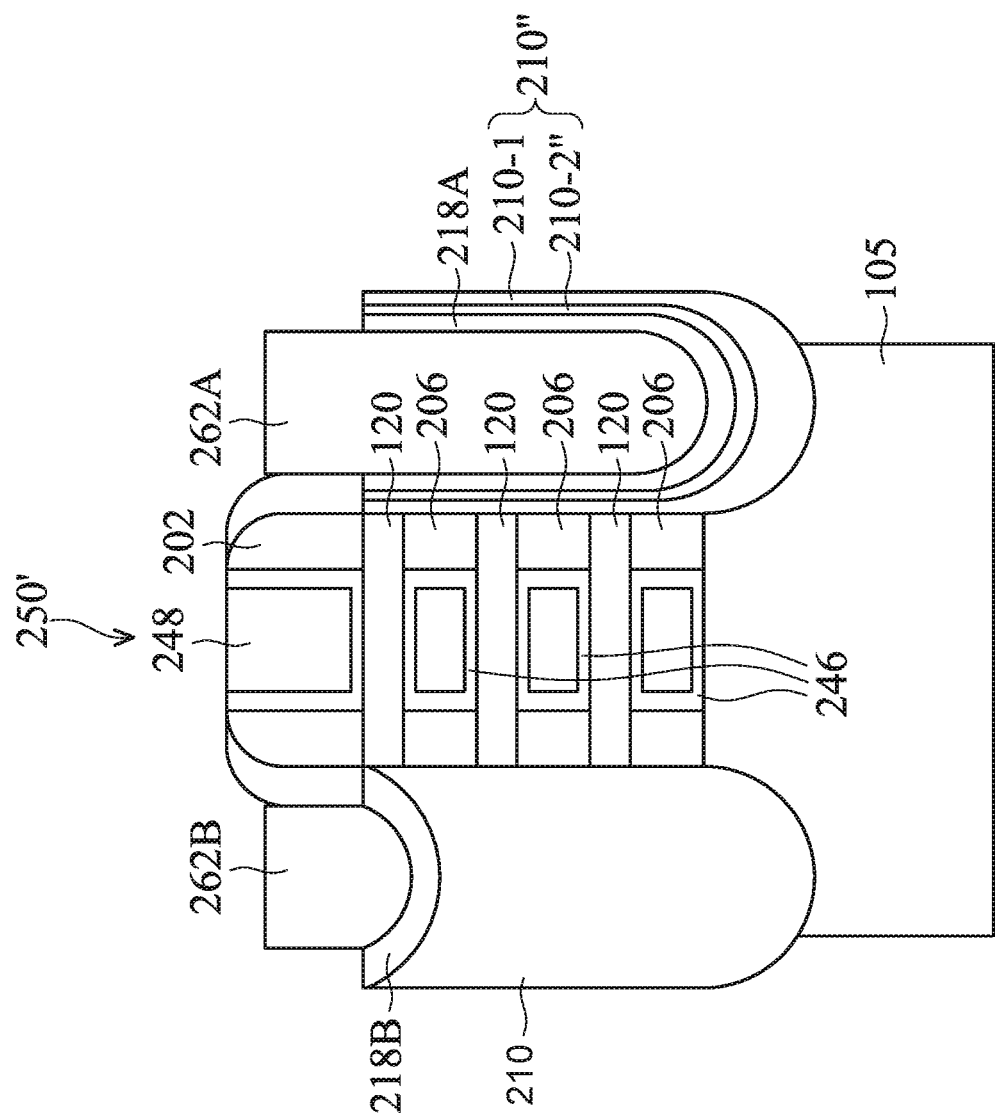

Although the disclosure above describes forming symmetric source and drain features, in some embodiments, the source and drain features may be asymmetric. For example, referring to FIG. 15, only one of the two source/drain features implements the method and structure described above. Accordingly, the source feature and the drain feature on both sides of the channel layers include different structures. For example, referring back to block 32 of FIG. 2, the etching of the first source/drain features is conducted with a masking element over and covering the drain region. Accordingly, the etching operation 520 only removes the epitaxial materials 210 from the source region. Therefore, while subsequent depositions of conductive materials form the conductive material layers 261 and 262 in the source region, substantially following the flow described above, the same deposition in the drain region form conductive material layers having different profiles and different locations. For example, in the drain region, the conductive material layers are formed over non-etched epitaxial material layer 210. Accordingly, following annealing operations, the silicide layer is spaced away from the semiconductor layers 120 and the inner spacers 206. In other words, the formed silicide layer 218 includes a source portion 218A similar to what has been described above and a drain portion 218B over the epitaxial material layer 210. Therefore, the silicide layer 218 has a smaller height and a smaller surface area in the drain region than those in the source region, respectively. Accordingly, the resistance on the source side may be less than the resistance on the drain side of the same device 100. In some embodiments, this may be beneficial to achieve a higher current level on the source side in order to provide sufficient level of current therein. For example, one source region may feed into multiple drain regions. Alternatively, the asymmetric source and drain features may include the drain side implementing the structures described above while the source side does not.

Figure 16:
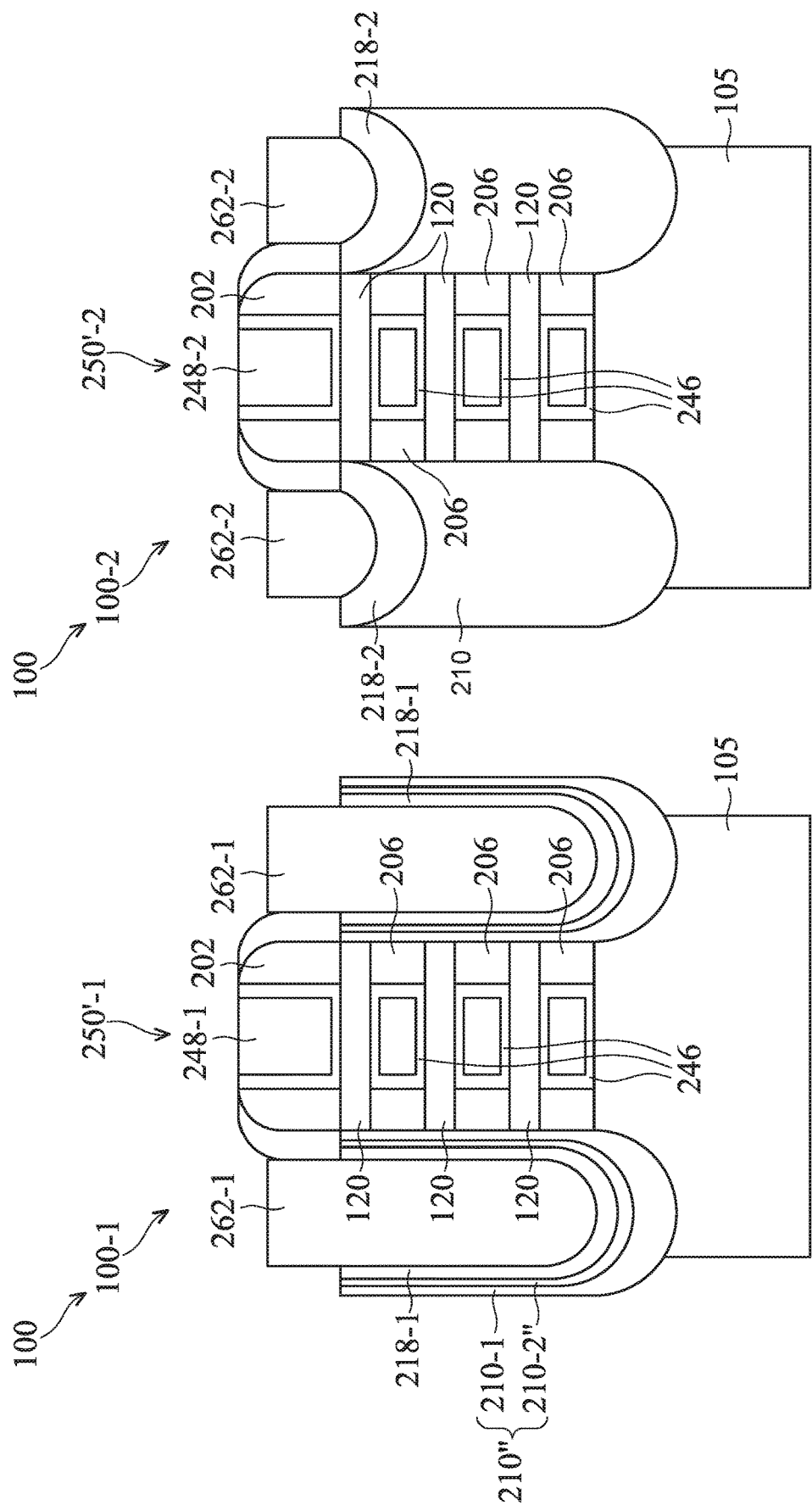

Referring to FIG. 16, in some embodiments, device 100 may be a CMOS device and includes a PMOS component 100-1 and an NMOS component 100-2. In some embodiments, the PMOS component 100-1 may implement the structure and methods described above, while the NMOS component 100-2 may not. This may be achieved by similarly implementing mask elements to cover relevant regions of the semiconductor substrate in the etching operation 520. As a result, the PMOS component 100-1 resembles the structure described above with respect to FIG. 12 and FIGS. 13 and 14. For example, the PMOS component 100-1 includes silicide layer 218-1 having a height 395 (see FIG. 12). However, the NMOS component 100-2 are formed without implementing the etching process 520. Accordingly, the NMOS component 100-2 include epitaxial layer 210 formed on sidewall surfaces of the semiconductor layers 120, and silicide layers 218-2 formed over a top surface of the epitaxial layer 210. The silicide layers 218-2 has a height substantially smaller than the height 395. Moreover, the gate structures 250'-1 for the PMOS component 100-1 may be formed with different materials and/or at a different time as the gate structures 250'-2 in the NMOS component 100-2. For example, a mask element may be formed to cover the NMOS region while the PMOS region is exposed for processing. After the gate structures 250'-1 in the PMOS regions are formed, the mask element may be removed from the NMOS region. A second mask element may be formed to cover the PMOS region while the NMOS region is exposed for processing. Accordingly, gate structures 250'-2 in the NMOS region may be formed. This process allows gate structures in the different transistor regions to include different materials. For example, the conductive metal layer 248-1 and 248-2 may each include a work function metal layer. The work function metal layer for the PMOS component 100-1 may include different materials from that of an NMOS component 100-2. In some embodiments, the work function metal layer for the PMOS component 100-1 includes a suitable p-type work function metal materials, such as titanium nitride (TiN), ruthenium (Ru), iridium (Ir), osmium (Os), rhodium (Rh), or combinations thereof; while the work function metal layer for the NMOS component 100-2 include a suitable n-type work function metal materials, such as aluminum (Al), titanium aluminum (TiAl), or combinations thereof. The conductive metal layer 248 may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof.

Though not intended to be limiting, embodiments of the present disclosure offer benefits for semiconductor processing and semiconductor devices. For example, the disclosed method provides a semiconductor device 100 device having reduced resistances both within the source/drain features and at the interface between the source/drain features and the semiconductor channel layers. In embodiments where only one side of the source/drain features of the transistor implements the method and structures described herein, the resistance inside the source/drain feature that implements the structure described herein is reduced by about 100 Ohm to about 150 Ohm. In embodiments where both sides of the source/drain features of the transistor implement the method and structures described herein, the resistance inside each of the source/drain features is reduced by about 100 Ohm to about 150 Ohm, for a total reduction of about 200 Ohm to about 300 Ohm. Furthermore, the increased surface area of the silicide layer 218 additionally contributes to the overall reduction of the contact resistance at the interface between the source/drain feature and the semiconductor channel layers 120. Accordingly, depending on whether one side or both sides of the source/drain features implement the structures and methods of the present disclosure the resistance is reduced by up to another 50 Ohm or 100 Ohm. In other words, the overall resistance of the device 100 may be reduced by about 100 Ohm to about 200 Ohm for each side of the source/drain features by implementing the methods and structures described herein. As such, the present disclosure provides methods that improve the device performance, functionality, and/or reliability of nanosheet-based transistors. Different embodiments may provide different benefits. Not all benefits are required for any embodiment.

In an exemplary aspect, the present disclosure is directed to a device. The device includes a semiconductor substrate, a stack of semiconductor layers over the semiconductor substrate, a gate structure over and between the stack of semiconductor layers, where the gate structure engages with the stack of semiconductor layers. Moreover, the device also includes a silicide layer extending along sidewall surfaces of the stack of semiconductor layers, and a source/drain feature on a sidewall surface of the silicide layer.

In some embodiments, the silicide layer extends along sidewall surfaces of each layer of the stack of semiconductor layers. In some embodiments, the source/drain feature includes a metal material. In some embodiments, the source/drain feature is a first source/drain feature. The device also includes a second source/drain feature having a semiconductor material. In some embodiments, the silicide layer extends from below a bottom surface of a lowest layer of the stack of semiconductor layers. In some embodiments, the silicide layer has a first sidewall surface facing the semiconductor layers and a second sidewall surface facing away from the semiconductor layers. Moreover, the second sidewall surface extends substantially parallel to the first sidewall surface. In some embodiments, the device also includes spacers between vertically adjacent layers of the stack of semiconductor layers. The spacers have spacer sidewalls facing the source/drain features. A sidewall surface of the silicide layer extends in parallel to the spacer sidewalls. In some embodiments, the device further includes a semiconductor layer interposing between the semiconductor layers and the silicide layer. In some embodiments, the semiconductor layer includes germanium (Ge). In some embodiments, the silicide layer has a first height along a vertical direction perpendicular to a top surface of the substrate. The semiconductor layer has a second height along the vertical direction. A ratio of the first height to the second height is about 5:1 to about 15:1.

In an exemplary aspect, the present disclosure is directed to a device. The device includes a semiconductor substrate, a first source/drain feature and a second source/drain feature over the semiconductor substrate, a stack of semiconductor layers between the first source/drain feature and the second source/drain feature, a gate structure between the first source/drain feature and the second source/drain feature. Moreover, the gate structure is further on and between adjacent layers of the stack of semiconductor layers. The device additionally includes a silicide layer between a sidewall surface of the semiconductor layer and a sidewall surface of the first source/drain feature.

In some embodiments, the device also includes an epitaxial layer between the silicide layer and the stack of semiconductor layers. In some embodiments, the epitaxial layer includes silicon germanium (SiGe). In some embodiments, the first source/drain feature includes a conductive material. In some embodiments, the second source/drain feature includes a semiconductor material. In some embodiments, the silicide layer extends from below a bottom surface of a lowest layer of the semiconductor layer to above a top surface of a topmost layer of the semiconductor layer.

In an exemplary aspect, the present disclosure is directed to a method. The method includes receiving a workpiece that has a stack of semiconductor layers over a substrate and a gate structure over the stack of semiconductor layers. The method also includes recessing the stack of semiconductor layers to form first source/drain trenches, forming a first source/drain layer in the first source/drain trenches, recessing the first source/drain layers to form a second source/drain trenches, forming a silicide layer from the recessed first source/drain layer, and forming a second source/drain layer over the silicide layer.

In some embodiments, the recessing of the first source/drain layer includes recessing below a bottom surface of a lowest layer of the stack of semiconductor layers. In some embodiments, the forming of the silicide layer includes depositing a conductive material layer over the recessed first source/drain layers, and causing a chemical reaction between the conductive material layer and the recessed first source/drain layer. In some embodiments, the method also includes replacing a dummy gate stack of the gate structure to form a metal gate stack prior to the recessing of the first source/drain layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a semiconductor substrate;
   a stack of semiconductor layers over the semiconductor substrate;
   a gate structure over and between the stack of semiconductor layers, and engaging with the stack of semiconductor layers;
   a plurality of inner spacers disposed between two vertically adjacent semiconductor layers of the stack of semiconductor layers and next to the gate structure;
   an epitaxial layer extending along sidewall surfaces of the stack of semiconductor layers and sidewall surfaces of the plurality of inner spacers;
   a silicide layer extending along a sidewall surface of the epitaxial layer; and
   a source/drain feature on a sidewall surface of the silicide layer.

2. The device of claim 1, wherein the source/drain feature includes a metal material.

3. The device of claim 2, wherein the source/drain feature is a first source/drain feature, the device further comprising a second source/drain feature having a semiconductor material.

4. The device of claim 1, wherein the silicide layer extends from below a bottom surface of a lowest layer of the stack of semiconductor layers.

5. The device of claim 1, wherein the silicide layer has a first sidewall surface facing the stack of semiconductor layers and a second sidewall surface facing away from the stack of semiconductor layers, wherein the second sidewall surface extends substantially parallel to the first sidewall surface.

6. The device of claim 1, wherein the silicide layer has a first height along a vertical direction perpendicular to a top surface of the semiconductor substrate, a semiconductor layer of the stack of semiconductor layers has a second height along the vertical direction, and a ratio of the first height to the second height is about 5:1 to about 15:1.

7. The device of claim 1, wherein the source/drain feature is spaced apart from the plurality of inner spacers by the epitaxial layer and the silicide layer.

8. The device of claim 1, wherein a bottom surface of the source/drain feature is lower than a bottom surface of a bottommost semiconductor layer of the stack of semiconductor layers.

9. The device of claim 1, wherein composition of the epitaxial layer is different than composition of the stack of semiconductor layers.

10. The device of claim 9, wherein the epitaxial layer comprises a first layer and a second layer extending along an outer sidewall surface of the first layer, the first layer comprises boron doped silicon germanium, and the second layer comprises undoped silicon germanium.

11. A device, comprising:
    a semiconductor substrate;
    a first source/drain feature and a second source/drain feature over the semiconductor substrate;
    a stack of semiconductor layers between the first source/drain feature and the second source/drain feature;
    a first inner spacer disposed between the semiconductor substrate and a bottommost semiconductor layer of the stack of semiconductor layers;
    a gate structure between the first source/drain feature and the second source/drain feature and further on and between adjacent layers of the stack of semiconductor layers;
    an epitaxial layer extending along a sidewall surface of the first inner spacer and a sidewall surface the bottommost semiconductor layer of the stack of semiconductor layers; and
    a silicide layer between a sidewall surface of the epitaxial layer and a sidewall surface of the first source/drain feature.

12. The device of claim 11, wherein the epitaxial layer includes silicon germanium (SiGe).

13. The device of claim 11, wherein the first source/drain feature includes a conductive material.

14. The device of claim 11, wherein the second source/drain feature includes a semiconductor material.

15. The device of claim 11, wherein the silicide layer extends from below a bottom surface of the bottommost semiconductor layer of the stack of semiconductor layers to above a top surface of a topmost semiconductor layer of the stack of semiconductor layers.

16. The device of claim 14, further comprising:
    a source/drain contact disposed over the second source/drain feature, wherein the source/drain contact and the first source/drain feature comprise same composition, and a top surface of the source/drain contact is lower than a topmost surface of the gate structure.

17. A semiconductor device, comprising:
    a fin-shaped active region over a substrate and comprising a channel region and a source/drain region adjacent to the channel region;
    a gate structure over the channel region;
    inner spacers laterally disposed between the channel region and the gate structure;
    a source/drain layer in and over the source/drain region and coupled to the channel region; and
    a silicide layer and a continuous epitaxial layer disposed between the source/drain layer and the channel region, wherein the continuous epitaxial layer extends along sidewall surfaces of the inner spacers.

18. The semiconductor device of claim 17, wherein the silicide layer wraps around a lower portion of the source/drain layer.

19. The semiconductor device of claim 17, wherein the source/drain layer is formed of a metal layer.

20. The semiconductor device of claim 17, wherein a bottommost surface of the silicide layer is lower than a top surface of a bottommost inner spacer of the inner spacers.

* * * * *